(12) United States Patent
Yoshida et al.

(10) Patent No.: US 11,115,058 B2
(45) Date of Patent: Sep. 7, 2021

(54) CODING DEVICE, TRANSMITTER, DECODING DEVICE, AND RECEIVER

(71) Applicant: Mitsubishi Electric Corporation, Chiyoda-ku (JP)

(72) Inventors: Hideo Yoshida, Chiyoda-ku (JP); Shinya Hirakuri, Chiyoda-ku (JP); Toshiyuki Kuze, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/648,841

(22) PCT Filed: Sep. 27, 2017

(86) PCT No.: PCT/JP2017/034928
§ 371 (c)(1),
(2) Date: Mar. 19, 2020

(87) PCT Pub. No.: WO2019/064369
PCT Pub. Date: Apr. 4, 2019

(65) Prior Publication Data
US 2020/0266835 A1    Aug. 20, 2020

(51) Int. Cl.
*H03M 13/15* (2006.01)
*H03M 13/29* (2006.01)
(Continued)

(52) U.S. Cl.
CPC ... *H03M 13/1575* (2013.01); *H03M 13/1102* (2013.01); *H03M 13/152* (2013.01);
(Continued)

(58) Field of Classification Search
CPC ......... H03M 13/1575; H03M 13/1102; H03M 13/152; H03M 13/2906; H03M 13/6522; H03M 13/6552
See application file for complete search history.

(56) References Cited

U.S. PATENT DOCUMENTS 5,546,409 A * 8/1996 Karasawa ............. H03M 13/29
714/755
5,790,569 A   8/1998 Kojima et al.
(Continued)

FOREIGN PATENT DOCUMENTS

JP    WO 96/32718 A1    10/1996
JP         11-3573 A      1/1999
(Continued)

OTHER PUBLICATIONS

International Search Report dated Dec. 19, 2017 in PCT/JP2017/034928 filed on Sep. 27, 2017, 2 pages.
(Continued)

*Primary Examiner* — Kyle Vallecillo
(74) *Attorney, Agent, or Firm* — Oblon, McClelland, Maier & Neustadt, L.L.P.

(57) ABSTRACT

In a coding device (20), a first coding unit (21) generates a parity of an RS code by coding, based on the RS code, each first data sequence existing in a direction different from a row direction of input data, and generates coded data by attaching the parity of the RS code to each first data sequence, thereby consequently expanding a matrix. A second coding unit (22) generates a parity of a BCH code and a parity of an LDPC code by coding, based on the BCH code and the LDPC code, each second data sequence existing in a row direction of the coded data, and generates a plurality of DVB-S2 frames (13) including, per DVB-S2 frame (13), one data sequence existing in the row direction of the coded data, the corresponding parity of the BCH code, and the corresponding parity of the LDPC code.

17 Claims, 16 Drawing Sheets

(51) Int. Cl.
  *H03M 13/11* (2006.01)
  *H03M 13/00* (2006.01)
(52) U.S. Cl.
  CPC ... *H03M 13/2906* (2013.01); *H03M 13/6522* (2013.01); *H03M 13/6552* (2013.01)

(56) References Cited

U.S. PATENT DOCUMENTS

| | | | |
|---|---|---|---|
| 6,131,178 | A | 10/2000 | Fujita et al. |
| 6,182,263 | B1 | 1/2001 | Kojima et al. |
| 6,907,125 | B1* | 6/2005 | Oishi ............... H04L 1/0045 380/239 |
| 8,418,041 | B2 | 4/2013 | Lee et al. |
| 9,485,054 | B2* | 11/2016 | Itakura ............ H04N 19/15 |
| 2005/0289437 | A1* | 12/2005 | Oh ................ H03M 13/1148 714/758 |
| 2008/0104481 | A1* | 5/2008 | Ito .................... H03M 13/15 714/758 |
| 2008/0282310 | A1 | 11/2008 | Koppelaar et al. |
| 2009/0199073 | A1* | 8/2009 | Kanaoka ........ H03M 13/2721 714/758 |
| 2010/0241923 | A1* | 9/2010 | Wang ............... H03M 13/253 714/755 |
| 2010/0275104 | A1 | 10/2010 | Kubo et al. |
| 2011/0154151 | A1* | 6/2011 | Matsumoto ...... H03M 13/1168 714/752 |
| 2011/0246863 | A1 | 10/2011 | Miyauchi et al. |

FOREIGN PATENT DOCUMENTS

| | | |
|---|---|---|
| JP | 3071828 B2 | 7/2000 |
| JP | 2006-295510 A | 10/2006 |
| JP | 2009-17160 A | 1/2009 |
| JP | 2010-258937 A | 11/2010 |

OTHER PUBLICATIONS

"Digital Video Broadcasting (DVB); Second generation framing structure, channel coding and modulation systems for Broadcasting, Interactive Services, News Gathering and other broadband satellite applications; Part 1: DVB-S2," European Telecommunications Standards Institute (ETSI), ETSI EN 302 307-1 VI.4.1, 2014, pp. 1-80.

"CCSDS Space Link Protocols Over ETSI DVB-S2 Standard," Consultative Committee for Space Data Systems (CCSDS), CCSDS 131.3-B-1, Mar. 2013, 32 total pages.

Falcao, G. et al., "GPU-based DVB-S2 LDPC decoder with high throughput and fast error floor detection," Electronics Letters, vol. 47, No. 9, Apr. 2011, 2 total pages.

Extended European Search Report dated Sep. 8, 2020 in European Patent Application No. 17927721.5, 9 pages.

Lei, J., et al., "Link-Layer FEC and Cross-Layer Architecture for DVB-S2 Transmission With QoS in Railway Scenarios", IEEE Transactions on Vehicular Technology, vol. 58, No. 8, Oct. 2009, XP011268603, pp. 4265-4276.

* cited by examiner

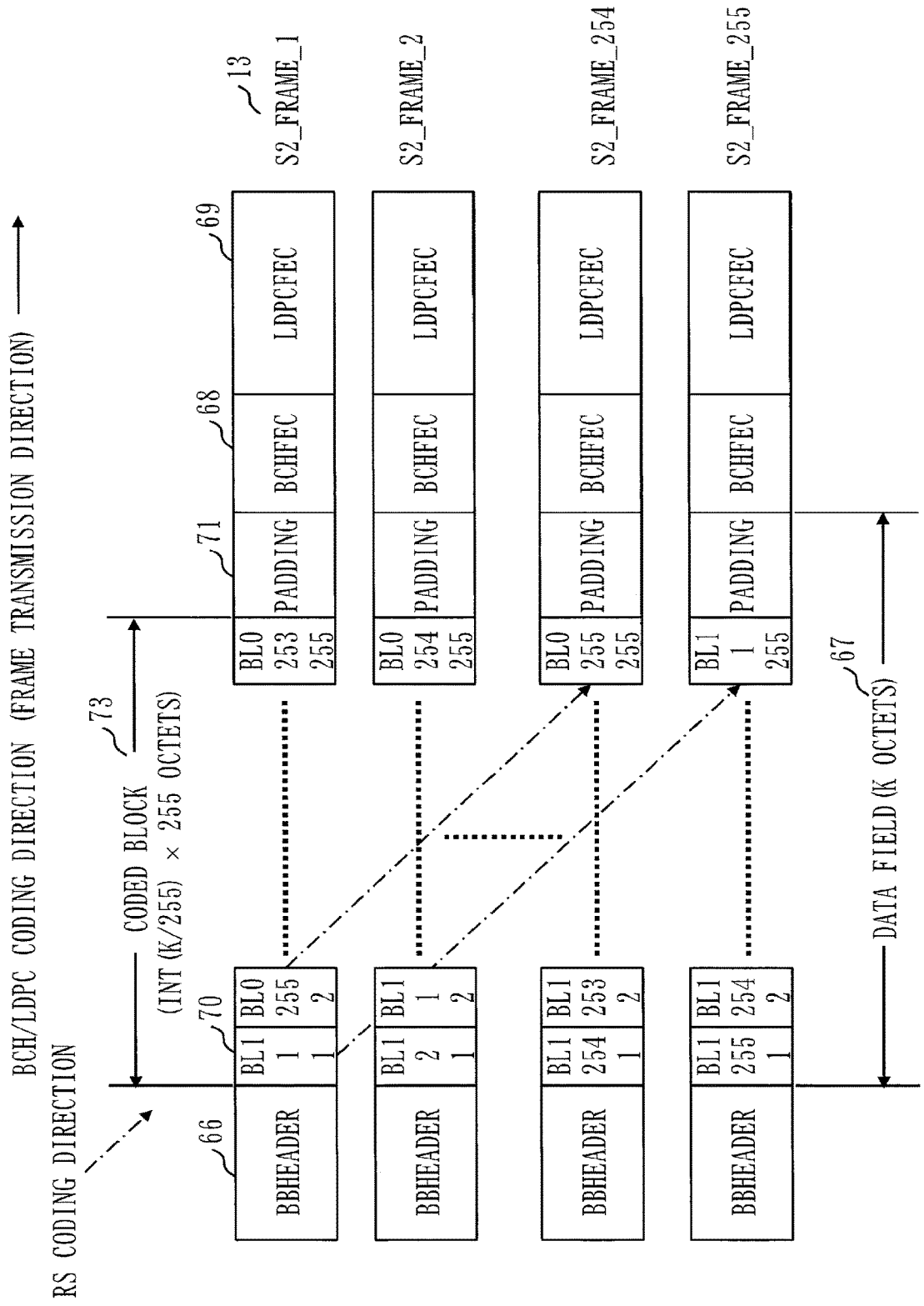

CODING DEVICE, TRANSMITTER, DECODING DEVICE, AND RECEIVER

TECHNICAL FIELD

The present invention relates to a coding device, a transmitter, a decoding device, and a receiver.

BACKGROUND ART

In a transmission device for satellite communication and so on, an error-correcting code is generally applied as an effective method for realizing high transmission capacity and long-distance transmission. The error-correcting code is a technique used in a wired communication system, a wireless communication system, a storage device, and so on. The error-correcting code is a technique that attaches a redundant bit to digital data to be sent out on the transmission side so that even if an error occurs in received data, the error can be corrected.

DVB-S2 indicated in Non-Patent Literature 1 employs an error-correcting code of a concatenated code scheme in which an LDPC code is an inner code and a BCH code is an outer code. Note that "DVB-S2" stands for DVB system for Satellite broadcasting and unicasting, 2nd generation, "DVB" stands for Digital Video Broadcasting, "LDPC" stands for Low Density Parity Check, and "BCH" stands for Bose-Chaudhuri-Hocquenghem.

Non-Patent Literature 2 indicates a satellite transmission scheme using the DVB-S2 system.

A DVB-S2 BB frame includes: an 80-bit fixed-length BB header including control information; user data; and padding for adjusting the frame length. "BB" stands for BaseBand.

In the error-correcting code of DVB-S2, BCH coding is performed on a BB frame. As a result, a parity of a BCH code is generated. The parity of the BCH code is attached to the BB frame. Thus, a BCH coded block is obtained. Subsequently, LDPC coding is performed. Consequently, a parity of an LDPC code is generated. The parity of the LDPC code is attached to a BCH coded block, thereby obtaining an LDPC coded block. The LDPC coded block is bit-interleaved according to the modulation mode, and then modulated and transmitted.

On the decoding side, processing is performed in the reverse order to that on the coding side. That is, the received and demodulated signal is bit-deinterleaved according to the modulation mode, and an LDPC coded block is obtained from the bit-deinterleaved signal. The LDPC coded block is decoded using the LDPC code which is an inner code. As a result, a BCH coded block whose error has been corrected using the LDPC code is obtained. Subsequently, decoding is performed using a BCH code which is an outer code. As a result, a BB frame in which an error that was not corrected completely using the LDPC code is corrected is outputted.

In DVB-S2, a plurality of LDPC coding rates are prepared. The BB frame length and the BCH parity bit length differ depending on the coding rate. The BB frame length is divisible by 8 bits. Note that 8 bits corresponds to 1 octet.

The LDPC code is known as a code having a strong correction capability. At the same time, it is also known that with the LDPC code, an error floor occurs. An error floor is a phenomenon in which BER does not improve even when the transmission power is increased. Note that "BER" stands for Bit Error Rate. In DVB-S2, in order to remove the error floor of the LDPC code, the BCH code which is a kind of block code is used as the outer code, as mentioned above.

According to Non-Patent Literature 3, in DVB-S2, when SNR becomes higher than a certain level, a phenomenon occurs that the correction effect by the concatenated code decreases. That is, in DVB-S2, an error floor still occurs. Note that "SNR" stands for Signal to Noise Ratio. In higher-speed transmission, a more reliable correction capability and a more reliable burst-resistant correction capability are required.

Patent Literature 1 discloses a configuration in which an interleave circuit is inserted between a coding circuit of a BCH code being an outer code and a coding circuit of an LDPC code being an inner code, in order to avoid an occurrence of an error floor.

With a method indicated in Patent Literature 2, data protected by an MPE-FEC error-correcting code prepared independently of DVB-S2 is divided into a plurality of packets attached with a CRC, and the plurality of divided packets are transmitted by a BB frame. Then, an error remaining after decoding with DVB-S2 is detected by CRC. Note that "MPE" stands for Multi-Protocol Encapsulation, "FEC" stands for Forward Error Correction, and "CRC" stands for Cyclic Redundancy Check.

CITATION LIST

Patent Literature

Patent Literature 1: JP 2009-017160 A
Patent Literature 2: Specification of U.S. Pat. No. 8,418,041

Non-Patent Literature

Non-Patent Literature 1: ETSI EN 302 307-1 V1.4.1, "Digital Video Broadcasting (DVB); Second generation framing structure, channel coding and modulation systems for Broadcasting, Interactive Services, News Gathering and other broadband satellite applications; Part 1: DVB-S2", European Telecommunications Standards Institute (ETSI), November 2014

Non-Patent Literature 2: CCSDS 131.3-B-1, "CCSDS Space Link Protocols over ETSI DVB-S2 Standard", Consultative Committee for Space Data Systems (CCSDS), March 2013

Non-Patent Literature 3: G. Falcao, J. Andrade, V. Silva and L. Sousa, "GPU-based DVB-S2 LDPC decoder with high throughput and fast error floor detection", Electronics Letters Vol. 47, No. 9, April 2011

SUMMARY OF INVENTION

Technical Problem

In the configuration indicated in Patent Literature 1, an interleave circuit is provided to the input side of BCH coding, and a deinterleave circuit is provided to the output side of BCH coding. Therefore, the processing delay time required for coding or decoding a plurality of BCH code sequences becomes long.

In the method indicated in Patent Literature 2, data protected by a separate error-correcting code independent from the BCH code, being an outer code of DVB-S2, and from the LDPC code, being an inner code, is divided, and a CRC is attached to each obtained packet. Therefore, the redundancy of the error-correcting code increases.

Even when a correction capability with higher reliability than in the conventional scheme and a burst-resistant correction capability with higher reliability than in the conventional scheme can be obtained, if the processing delay time becomes long or the redundancy increases, it becomes difficult to realize high-speed transmission.

An objective of the present invention is to make it possible to achieve a highly reliable correction capability and a highly reliable burst-resistant correction capability even in high-speed transmission.

Solution to Problem

A coding device according to an aspect of the present invention includes:

a first coding unit to generate a parity of a first error-correcting code by coding, based on the first error-correcting code, each first data sequence existing in a direction different from a row direction of input data regarded as one matrix, and to generate coded data by attaching the parity of the first error-correcting code to each first data sequence, thereby consequently expanding the matrix; and a second coding unit to generate a parity of a second error-correcting code by coding, based on the second error-correcting code, each second data sequence existing in a row direction of the coded data generated by the first coding unit, and to generate a plurality of frames including, per frame, one data sequence existing in the row direction of the coded data, and a corresponding parity of the second error-correcting code.

A decoding device according to an aspect of the present invention includes:

a second error-correcting unit to obtain a plurality of frames including, per frame, one data sequence existing in a row direction of coded data regarded as one matrix, and a corresponding parity of a second error-correcting code, and to perform error correction on each second data sequence existing in the row direction of the coded data, using the parity of the second error-correcting code; and a first error-correcting unit to obtain a parity of a first error-correcting code attached to each first data sequence existing in a direction different from the row direction of the coded data on which error correction by the second error-correcting unit has been done, and to perform error correction on each first data sequence using the parity of the first error-correcting code.

Advantageous Effects of Invention

According to the present invention, by applying a first error-correcting code in a direction different from that of a second error-correcting code, a highly reliable correction capability and a highly reliable burst-resistant correction capability can be achieved even in high-speed transmission.

BRIEF DESCRIPTION OF DRAWINGS

FIG. 16 is a diagram illustrating an example of allocating coded data to frames according to Embodiment 6.

DESCRIPTION OF EMBODIMENTS

Figure 1:
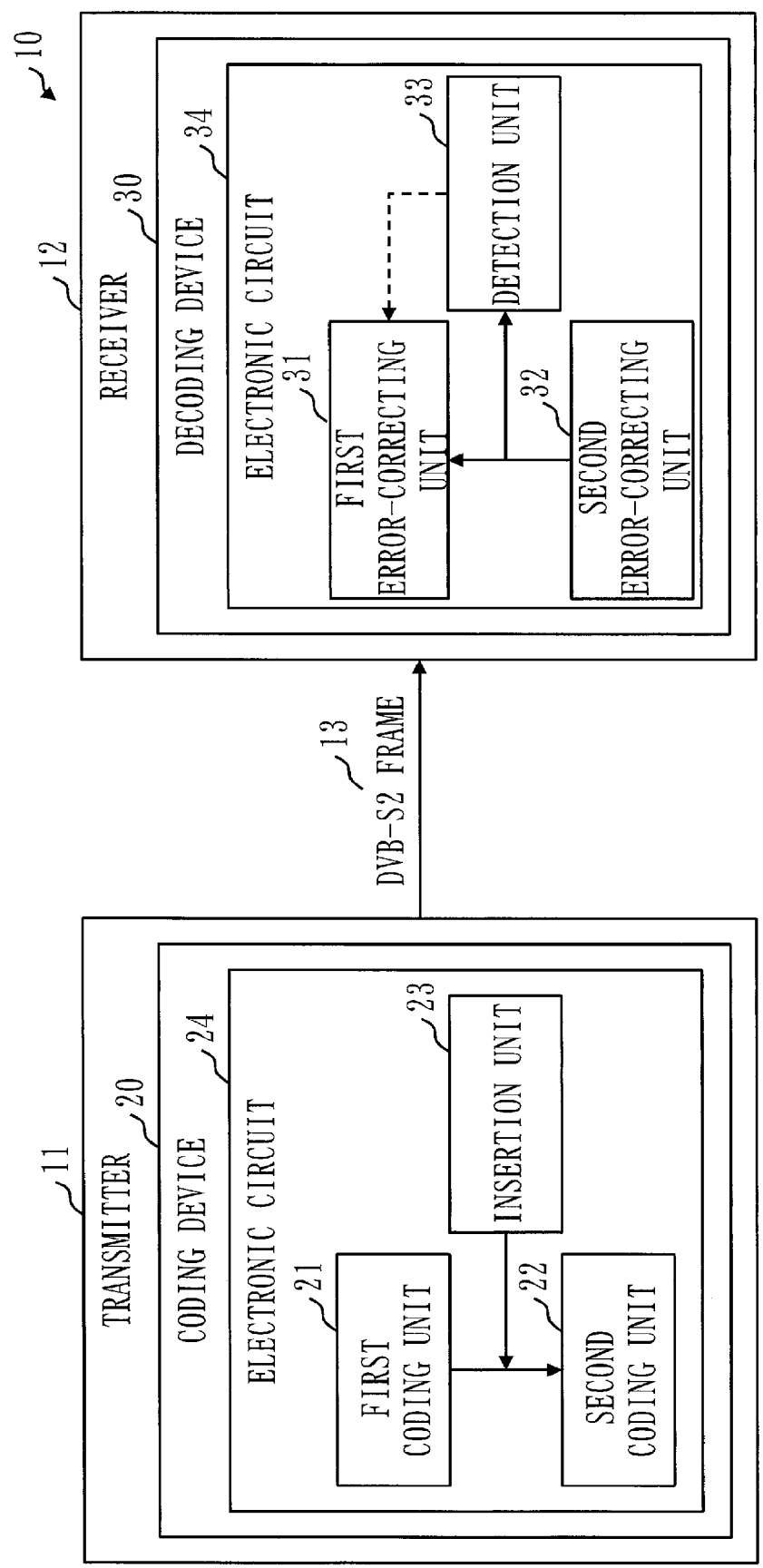
FIG. 1 is a block diagram illustrating a configuration of a communication system according to Embodiment 1.

Embodiments of the present invention will be described with referring to drawings. In the drawings, the same or equivalent portions are denoted by the same reference numerals. In the description of embodiments, explanation of the same or equivalent portions will be omitted or simplified appropriately. The present invention should not be construed as being limited to the embodiments described below, and various changes can be made to the present invention where necessary. For example, of the embodiments described below, two or more embodiments may be combined and practiced. Alternatively, of the embodiments described below, one embodiment or a combination of two or more embodiments may be practiced partially.

Embodiment 1

The present embodiment will be described with referring to FIGS. 1 to 5.

*Description of Configuration*

A configuration of a communication system 10 according to the present embodiment will be described with referring to FIG. 1.

The communication system 10 is provided with a transmitter 11 and a receiver 12.

The transmitter 11 is provided with a coding device 20. The transmitter 11 can be any apparatus as far as it transmits a plurality of frames obtained from the coding device 20 to an outside. In the present embodiment, the transmitter 11 is a satellite station.

The receiver 12 is provided with a decoding device 30. The receiver 12 can be any apparatus as far as it receives a plurality of frames from an outside and supplies the plurality of frames to the decoding device 30. In the present embodiment, the receiver 12 is a ground station.

The frame transmitted and received between the transmitter 11 and the receiver 12 is, in the present embodiment, a DVB-S2 frame 13. Alternatively, the frame may be a frame of DVB-S2X which is an advanced version of DVB-S2, or a frame of another transmission scheme such as DVB-T2 and ISDB-S3. Note that "DVB-S2X" stands for DVB-S2 Extensions, "DVB-T2" stands for DVB system for Terrestrial broadcasting, 2nd generation, and "ISDB-S3" stands for Integrated Services Digital Broadcasting for Satellite, 3rd generation.

In addition to communication between a ground station and a satellite station, the communication system 10 of Embodiment 1 may be used in data transmission for satellite communication between a portable terminal (ground terminal) for satellite communication and a satellite station, between a satellite station and a satellite station, and so on. In these cases, the receiver 12 serves as a potable terminal, or satellite station for satellite communication.

The coding device 20 of the transmitter 11 is provided with a first coding unit 21, a second coding unit 22, and an insertion unit 23. Functions of the first coding unit 21, second coding unit 22, and insertion unit 23 are implemented by hardware.

The coding device 20 is provided with hardware such as an electronic circuit 24.

The electronic circuit 24 is dedicated hardware that implements the functions of the first coding unit 21, second coding unit 22, and insertion unit 23. The electronic circuit 24 is, for example, a single circuit, a composite circuit, a programmed processor, a parallel-programmed processor, a logic IC, a GA, an FPGA, or an ASIC. Note that "IC" stands for Integrated Circuit, "GA" stands for Gate Array, "FPGA" stands for Field-Programmable Gate Array, and "ASIC" stands for Application Specific Integrated Circuit.

The coding device 20 may be provided with a plurality of electronic circuits which substitute for the electronic circuit 24. The plurality of electronic circuits as a whole implement the functions of the first coding unit 21, second coding unit 22, and insertion unit 23. Each electronic circuit is, for example, a single circuit, a composite circuit, a programmed processor, a parallel-programmed processor, a logic IC, a GA, an FPGA, or an ASIC.

The decoding device 30 of the receiver 12 is provided with a first error-correcting unit 31, a second error-correcting unit 32, and a detection unit 33. Functions of the first error-correcting unit 31, second error-correcting unit 32, and detection unit 33 are implemented by hardware.

The decoding device 30 is provided with hardware such as an electronic circuit 34.

The electronic circuit 34 is dedicated hardware that implements the functions of the first error-correcting unit 31, second error-correcting unit 32, and detection unit 33. The electronic circuit 34 is, for example, a single circuit, a composite circuit, a programmed processor, a parallel-programmed processor, a logic IC, a GA, an FPGA, or an ASIC.

The decoding device 30 may be provided with a plurality of electronic circuits which substitute for the electronic circuit 34. The plurality of electronic circuits as a whole implement the functions of the first error-correcting unit 31, second error-correcting unit 32, and detection unit 33. Each electronic circuit is, for example, a single circuit, a composite circuit, a programmed processor, a parallel-programmed processor, a logic IC, a GA, an FPGA, or an ASIC.

A configuration example of the first coding unit 21 and insertion unit 23 of the coding device 20 will be described with referring to FIG. 2.

In the present example, the first coding unit 21 is provided with an input terminal 41 for input data 61, RS coding circuits 42 which perform RS coding, an input terminal 43 and output terminal 44 of each RS coding circuit 42, a connection terminal 45 connected to the output terminal 44, a connection terminal 46 connected to the input terminal 41, and a connection terminal 47 selectively connected to the connection terminal 45 and connection terminal 46. Note that "RS" stands for Read-Solomon. A quantity of RS coding circuits 42 is K. Hence, a quantity of input terminals 43 is K and a quantity of output terminals 44 is K. The connection terminal 47 is connected to a selector 63.

The insertion unit 23 is provided with an ASM generation circuit 48 which generates an ASM, and an output terminal 49 of the ASM generation circuit 48. Note that "ASM" stands for Attached Synchronization Marker.

The first coding unit 21 is further provided with an output terminal 50 to be selectively connected to the connection terminal 47 and output terminal 49.

Figure 3:
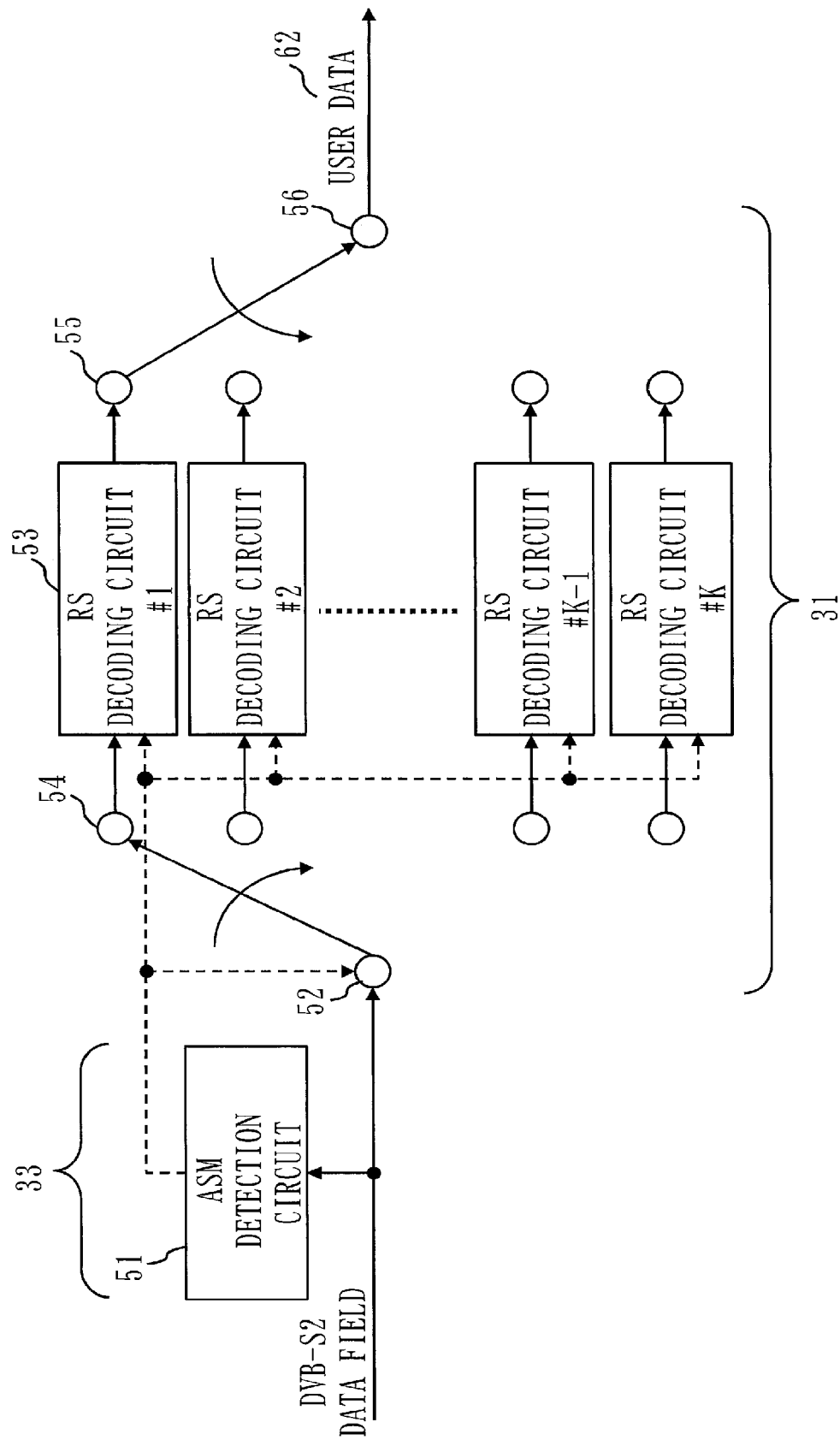
FIG. 3 is a block diagram illustrating a configuration example of part of a decoding device according to Embodiment 1.

A configuration example of the first error-correcting unit 31 and detection unit 33 of the decoding device 30 will be described with referring to FIG. 3.

In the present example, the detection unit 33 is provided with an ASM detection circuit 51 which detects the ASM out of the DVB-S2 frame 13.

The first error-correcting unit 31 is provided with an input terminal 52 for data being a decoding target, RS decoding circuits 53 corresponding to the RS coding circuits 42, an input terminal 54 and output terminal 55 of each RS decoding circuit 53, and an output terminal 56 connected to the output terminal 55. A quantity of RS decoding circuits 53 is K. Hence, a quantity of input terminals 54 is K and a quantity of output terminals 55 is K.

*Description of Behavior*

Behavior of the coding device 20 according to the present embodiment will be described with referring to FIG. 4. The behavior of the coding device 20 corresponds to a coding method according to the present embodiment.

In the present embodiment, an RS code is used as a first error-correcting code, and a concatenated code is used as a second error-correcting code. As the concatenated code, a combination of a BCH code which is an outer code and an LDPC code which is an inner code is used in line with DVB-S2. The first error-correcting code may be an error-correcting code other than an RS code, such as an expanded RS code. If the transmission scheme employed by the transmitter 11 and receiver 12 is other than DVB-S2, the second error-correcting code may be an error-correcting code other than a combination of a BCH code and an LDPC code, or may be an error-correcting code other than a concatenated code.

The first error-correcting code is specifically an RS code having a 255-symbol code length and a 253-symbol information length and capable of one-symbol correction where 1 octet is one symbol. That is, the first error-correcting code is an RS code having a 255-octet code length and a 253-octet information length. The coding rate is 253/255=0.992, which is a small overhead. Assume that a user data field 67 "DATA FIELD" of the DVB-S2 frame 13 has a K octet length. The code length and information length of the RS may be changed as necessary.

The input data 61 is coded in units of 253×K octet blocks. Each time K of parallel RS coding circuits 42 code one block of the input data 61, the K of parallel RS coding circuits 42 generate a parity of the RS code. The selector 63 selects and outputs the input data 61 and the parity of the RS code. Thus, interleaved 255×K octet coded data 64 is obtained. An identifier 65 which is a sync signal for identifying a top of the coded data 64 is attached to the top of the coded data 64. In the present embodiment, the identifier 65 is an ASM indicated in Non-Patent Literature 2. The coded data 64 attached with the identifier 65 is inserted in the user data field 67 "DATA FIELD" of the DVB-S2 frame 13 in units of K octets. Data elements constituting the DVB-S2 frame 13 are a header field 66 "BBHEADER" which stores control information, the K octet user data field 67 "DATA FIELD", a parity field 68 "BCHFEC" of the BCH code being an outer code, and a parity field 69 "LDPCFEC" of an LDPC code being an inner code.

In the present embodiment, the input data 61 is inputted to the coded data 64 in units of octets via the selector 63 and is inputted at cycles of K octets to the RS coding circuits 42 which generate the parities of K of RS codes. The storage element of the parity of one RS code consists of 2 octets at the most. When the 253×K octet input data 61 is entirely inputted to the coded data 64 and the RS coding circuits 42, the selector 63 selects an RS coding circuit 42 side, outputs the 2 octet parity of each RS code in units of octets and at the cycles of K octets, and inputs the parity to the coded data 64.

As the identifier 65 that separates the pieces of coded data 64, an ASM is added to the top of the coded data 64 consisting of 255×K octets. The length of the ASM is desirably a multiple of octet, such as 4 octets, since in the RS code, one symbol corresponds to 1 octet. The ASM and the coded data 64 are allocated to the K octet user data fields 67 "DATA FIELD" of the DVB-S2 frames 13. Due to the presence of the inserted AMS, there may be a case where some sequences out of K of RS code sequences, that is, 4 code sequences, cannot be allocated to one DVB-S2 frame 13, because the ASM has 4 octets. In the present embodiment, however, these 4 code sequences will be allocated to the next DVB-S2 frame 13, and thus no problem arises. Insertion of information to the header field 66, generation of the parity of the BCH code, and generation of the parity of an LDPC code, which are for constituting the DVB-S2 frame 13 are performed in the same manner as in a conventional case.

Figure 5:
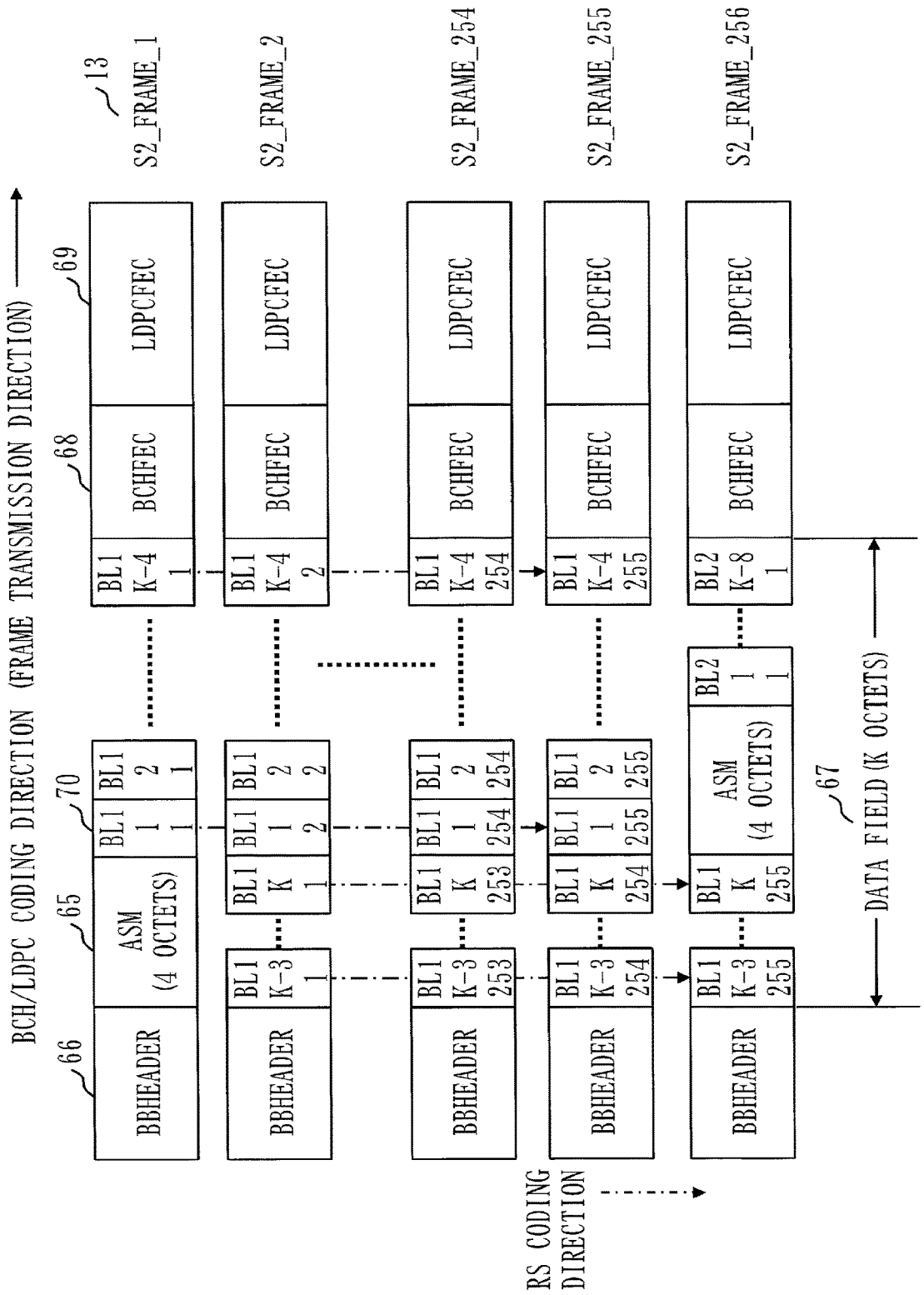
FIG. 5 is a diagram illustrating an example of allocating coded data to frames according to Embodiment 1.

FIG. 5 illustrates an example of allocating the coded data 64 to the DVB-S2 frames 13.

In FIG. 5, the coded data 64 excluding the ASM is regarded as small blocks 70 in units of 1 octet. In the small block 70, the upper stage has a block number of the coded data 64, the middle stage has a number of the RS code sequence, and the lower stage has an input number of the RS code. For example, in a small block 70 located at the top of the coded data 64 identified by "BL1", the upper stage has "BL1", the medium stage has "1" indicating the first RS code sequence, and the lower stage has "1" indicating a first symbol. In the last small block 70 in the coded data 64 identified by "BL1", the upper stage has "BL1", the medium stage has "K" indicating a Kth RS code sequence, and the lower stage has "255" indicating a 255th symbol. The 254th and 255th symbols are each a parity symbol of the RS code.

The ASM is inserted in the user data field 67 "DATA FIELD" of the DVB-S2 frame 13 at the top. Thus, data until the top symbol of a (K−4)th RS code sequence is inputted in the K octet user data field 67 "DATA FIELD". The top symbol of a (K−3)th RS code sequence is allocated to the top of the user data field 67 of the next DVB-S2 frame 13. After the parities of K of RS code sequences are inputted to follow the input data 61, the "BL1" coded data 64 terminates, and the ASM of "BL2" is inputted successively.

As described above, by inserting the ASM, symbols of the same numbers are allocated to different places in the user data fields 67 "DATA FIELD" of the DVB-S2 frames 13, according to the RS code sequences. However, only one symbol or less of each RS code sequence is allocated to the user data field 67 "DATA FIELD" of one DVB-S2 frame 13. Therefore, even when errors remain in one DVB-S2 frame 13 entirely, they appear as an error of as small as one symbol, that is, an error of 1 octet, from the viewpoint of the RS code sequence.

The behavior of the coding device 20 in the example of FIG. 2 will be described.

In the present example, the 253×K octet input data 61 is inputted to the input terminal 41 in units of octets. Since the RS code having a 255 octet code length and a 253 octet information length is used, each RS coding circuit 42 only requires a storage circuit for computation of a 2 octet parity. Data from the input terminal 41 is inputted via the input terminal 43 of one RS coding circuit 42, and at the same time is outputted to the user data field 67 "DATA FIELD" of the DVB-S2 frame 13 via the connection terminal 46, the connection terminal 47, and the output terminal 50. Before that, the ASM from the ASM generation circuit 48 via the output terminal 49 is outputted to the user data field 67 "DATA FIELD" of the DVB-S2 frame 13 in units of octets via the connection terminal 47 and the output terminal 50. Part of the ASM may include a unique number having regularity, such as an increment pattern, which is capable of ARQ for each block of the input data 61. Note that "ARQ" stands for Automatic Repeat Request.

When inputting one block of the input data 61 is completed, upon each octet output, the output terminal 44 of the RS coding circuit 42 is switched and connected to the connection terminal 45. Furthermore, the parities of the RS codes are sequentially outputted in units of octets via the connection terminal 47 and the output terminal 50.

As described above, the input data 61 does not need to be stored temporarily and can be outputted to the DVB-S2 frames 13. Each RS coding circuit 42 only needs a storage circuit for storing a few parities of the RS codes. If inputting is performed in the same units as the RS code symbols, a computation circuit can be commonly used. Computation and outputting can be performed by the computation circuit with toggling the primary holding memories of the parities of the RS codes.

In place of performing inputting in units of octets each corresponding to an RS code symbol, a plurality of RS symbols may be inputted simultaneously. If a quantity of symbols to be inputted is a divisor of K, the computation circuit for the input symbols can be commonly used. Computation and outputting can be performed with toggling the primary holding memories of the parities of the RS codes.

Figure 2:
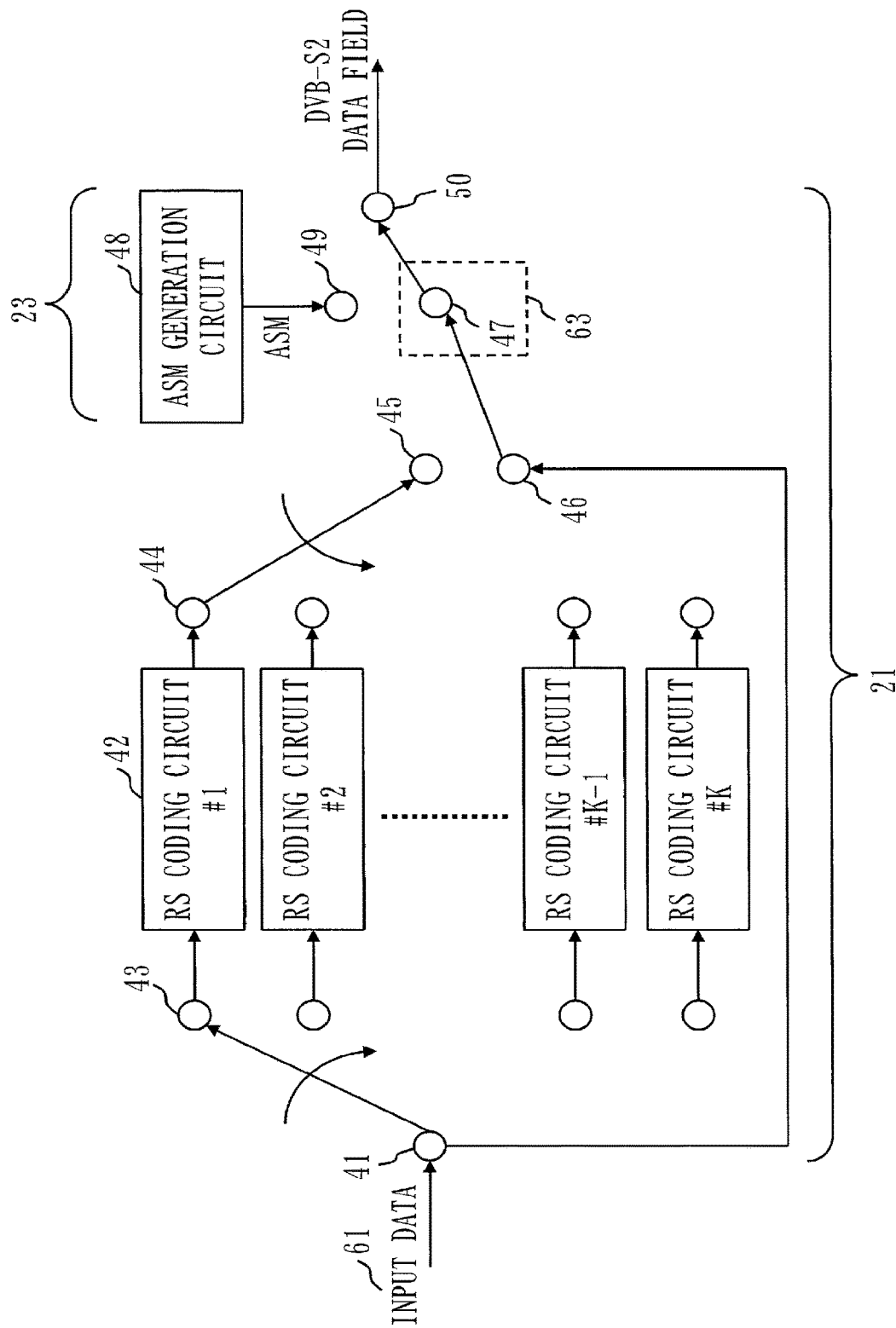
FIG. 2 is a block diagram illustrating a configuration example of part of a coding device according to Embodiment 1.

As illustrated particularly in FIG. 2, in the present embodiment, the first coding unit 21 divides the input data 61 among the plurality of first data sequences in units of one symbol or less. The first coding unit 21 generates the parity of the RS code for each first data sequence by coding the first data sequences using the RS code.

The second coding unit 22 divides the coded data 64 including the input data 61 and the parity generated by the first coding unit 21 into a plurality of second data sequences in units of data transmission. The second coding unit 22 generates a parity of the BCH code and a parity of the LDPC code for each second data sequence by coding each second data sequence using the BCH code and the LDPC code. The second coding unit 22 outputs the plurality of DVB-S2 frames 13 including, per DVB-S2 frame 13, one second data sequence and the corresponding parities.

Specifically, the first coding unit 21 divides the input data 61 among K of first data sequences in units of symbols. In this division, the first coding unit 21 divides symbols which are included in the input data 61 and whose relative positions in the individual second sequences coincide, among the common first data sequences. The first coding unit 21 concatenates the parities corresponding to the individual first data sequences to the input data 61 in such an order that in the individual second data sequences, relative positions of the parities corresponding to the individual first data sequences and relative positions of the symbols divided among the individual first data sequences will coincide, thereby generating the coded data 64.

More specifically, the first coding unit 21 generates, as the parity of the RS code, parities having a plurality of symbols for each first data sequence. The first coding unit 21 divides the parities corresponding to the individual first data sequences among a plurality of parity sequences in units of symbols. The first coding unit 21 concatenates the plurality of parity sequences to the input data 61, thereby generating a data block. A quantity of symbols of the parity of the RS code may be arbitrary, and is two in the present embodiment.

The insertion unit 23 attaches the identifier 65 for identifying the block top of the input data 61 to the top of the coded data 64.

The second coding unit 22 divides the coded data 64 including the identifier 65 inserted by the insertion unit 23 into a plurality of second data sequences.

As illustrated particularly in FIG. 5, in the present embodiment, the first coding unit 21 generates a parity of the RS code by coding, based on the RS code, each first data sequence existing in a direction different from a row direction of the input data 61 regarded as one matrix. The first coding unit 21 generates the coded data 64 by attaching the parity of the RS code to each first data sequence, thereby consequently expanding the matrix.

The second coding unit 22 generates the parity of the BCH code and the parity of the LDPC code by coding, based on the BCH code and the LDPC code, each second data sequence existing in the row direction of the coded data 64 generated by the first coding unit 21. The second coding unit 22 generates the plurality of DVB-S2 frames 13 including, per DVB-S2 frame 13, one data sequence existing in the row direction of the coded data 64, the corresponding parity of the BCH code, and the corresponding parity of the LDPC code.

A data element existing in each row of each first data sequence has a data length of one symbol or less. Specifically, the data element existing in each row of each first data sequence has a data length of one symbol.

Each first data sequence exists in a column direction of the input data 61. Hence, the first coding unit 21 generates the coded data 64 and consequently expands the matrix in the column direction. In the example of FIG. 5, the 253-row, K-column matrix is expanded to a 255-row, K-column matrix.

The insertion unit 23 inserts the identifier 65 for identifying the top of the coded data 64 in the first row of the coded data 64, thereby consequently shifting the matrix. In the example of FIG. 5, each row of the matrix expanded into the 255-row, K-column matrix is shifted rightward by 4 columns.

Each second data sequence exists in the row direction of the coded data 64 which is generated by the first coding unit 21 and in which the identifier is inserted by the insertion unit 23.

Specifically, the first coding unit 21 generates the parity of the RS code by coding, based on the RS code, first data sequences which are in a quantity that matches the length of the user data field 67 of one DVB-S2 frame 13. The first coding unit 21 inserts each data sequence existing in the row direction of the coded data 64, in the user data field 67 of each DVB-S2 frame 13.

Behavior of the decoding device 30 according to the present embodiment is reverse to the behavior of the coding device 20. The behavior of the decoding device 30 corresponds to a decoding method according to the present embodiment.

The behavior of the decoding device 30 in the example of FIG. 3 will be described.

The ASM detection circuit 51 detects the top of the block of the coding-side input data 61 by detecting the ASM from the user data field 67 "DATA FIELD" of the DVB-S2 frame 13. By detection of the top of the block of the input data 61, the ASM detection circuit 51 controls initialization of connection from the input terminal 52 to the input terminals 54 of the K of RS decoding circuits 53, and controls initial setting of input such that inputting from the input terminals 54 in units of octets to the K of RS decoding circuits 53 is performed at individual input timings. With a fixed processing delay, the RS decoding circuits 53 output the decoded data corrected at output timings, as user data 62 from the output terminals 55 via the output terminal 56 in units of octets.

Since the RS code having the 255 octet code length and the 253 octet information length is used, the RS decoding circuits 53 each require a delay memory and a storage circuit which are both necessary for syndrome computation. The delay memory affords decode-processing delay by the syndrome and the 255-symbol code length or the 253-symbol information length. The storage circuit is for computing a 2 octet syndrome. However, since a 1 octet error position and a size of the error which are the maximum correction capability can be immediately obtained from the 2 octet syndrome, the processing delay is small.

As described above, since the error position and its size can be obtained immediately after the syndrome computation, each RS decoding circuit 53 can perform decoding and outputting with a comparatively small delay memory which affords decode-processing delay and the code length or information length. If inputting is performed in the same units as the RS code symbols, a computation circuit can be commonly used. Decoding and outputting can be performed by the computation circuit with toggling the holding memories for syndrome computation.

In place of performing inputting in units of octets each corresponding to an RS code symbol, a plurality of RS symbols may be inputted at once. If a quantity of symbols to be inputted is a divisor of K, while input-data memories for syndrome computation and processing delay is required, a computation circuit for decoding can be commonly used. Decoding and outputting can be performed with toggling the primary holding memories for the syndrome of the RS code.

With an RS code for 3-symbol error correction or less, it is easy to obtain an error position and an error size immediately from the syndrome using the RS code.

As illustrated particularly in FIG. 5, the second error-correcting unit 32 obtains the plurality of DVB-S2 frames 13 including, per DVB-S2 frame 13, one data sequence existing in a row direction of the coded data 64 regarded as one matrix, the corresponding parity of the BCH code, and the corresponding parity of the LDPC. The second error-correcting unit 32 performs error correction on each second data sequence existing in the row direction of the coded data 64, using the parity of the BCH code and the parity of the LDPC code.

The first error-correcting unit 31 obtains the parity of the RS code attached to each first data sequence existing in a direction different from the row direction of the coded data 64 on which error correction by the second error-correcting unit 32 has been done. The first error-correcting unit 31 performs error correction on each first data sequence using the parity of the RS code.

\*\*\*Description of Effect of Embodiment\*\*\*

According to the present embodiment, by applying the first error-correcting code in a direction different from that of the second error-correcting code, a highly reliable correction capability and a highly reliable burst-resistant correction capability can be achieved even in high-speed transmission.

In the present embodiment, on the coding side, a plurality of RS code sequences each having a small redundancy bit and corresponding to the user data length of DVB-S2 are generated and divided among the plurality of DVB-S2 frames 13. An ASM is inserted in the top of a block consisting of the plurality of RS code sequences which are to be divided among the plurality of DVB-S2 frames 13. On the decoding side, the top of the block in which the plurality of RS code sequences are divided is recognized by the ASM, and error correction is performed using the RS code.

In the present embodiment, a burst error that an error remains in every user bit in several frames of DVB-S2 can be powerfully corrected without changing the frame configuration of DVB-S2 and with only requiring an overhead of the few parities of the RS codes, while requiring no large processing delay memory on the transmission side.

In the present embodiment, the few parities of the RS codes are generated and attached before BCH coding, without changing the frame header to be inputted to the BCH code, being an outer code of DVB-S2, and without changing the information bit sequence. On the decoding side, an error that was not corrected even using the BCH code after correction using the LDPC code, being an inner code of DVB-S2, can be corrected. Hence, an error correction device that is resistant to an error floor of the LDPC code and to a burst error can be obtained.

\*\*\*Other Configurations\*\*\*

In the present embodiment, the functions of the first coding unit 21, second coding unit 22, and insertion unit 23 of the coding device 20 are implemented by hardware. As a modification, the functions of the first coding unit 21, second coding unit 22, and insertion unit 23 may be implemented by software. In the present embodiment, also the functions of the first error-correcting unit 31, second error-correcting unit 32, and detection unit 33 of the decoding device 30 are implemented by hardware. As a similar modification, the functions of the first error-correcting unit 31, second error-correcting unit 32, and detection unit 33 may be implemented by software. Such a modification will be described mainly regarding its difference from the present embodiment.

Figure 6:
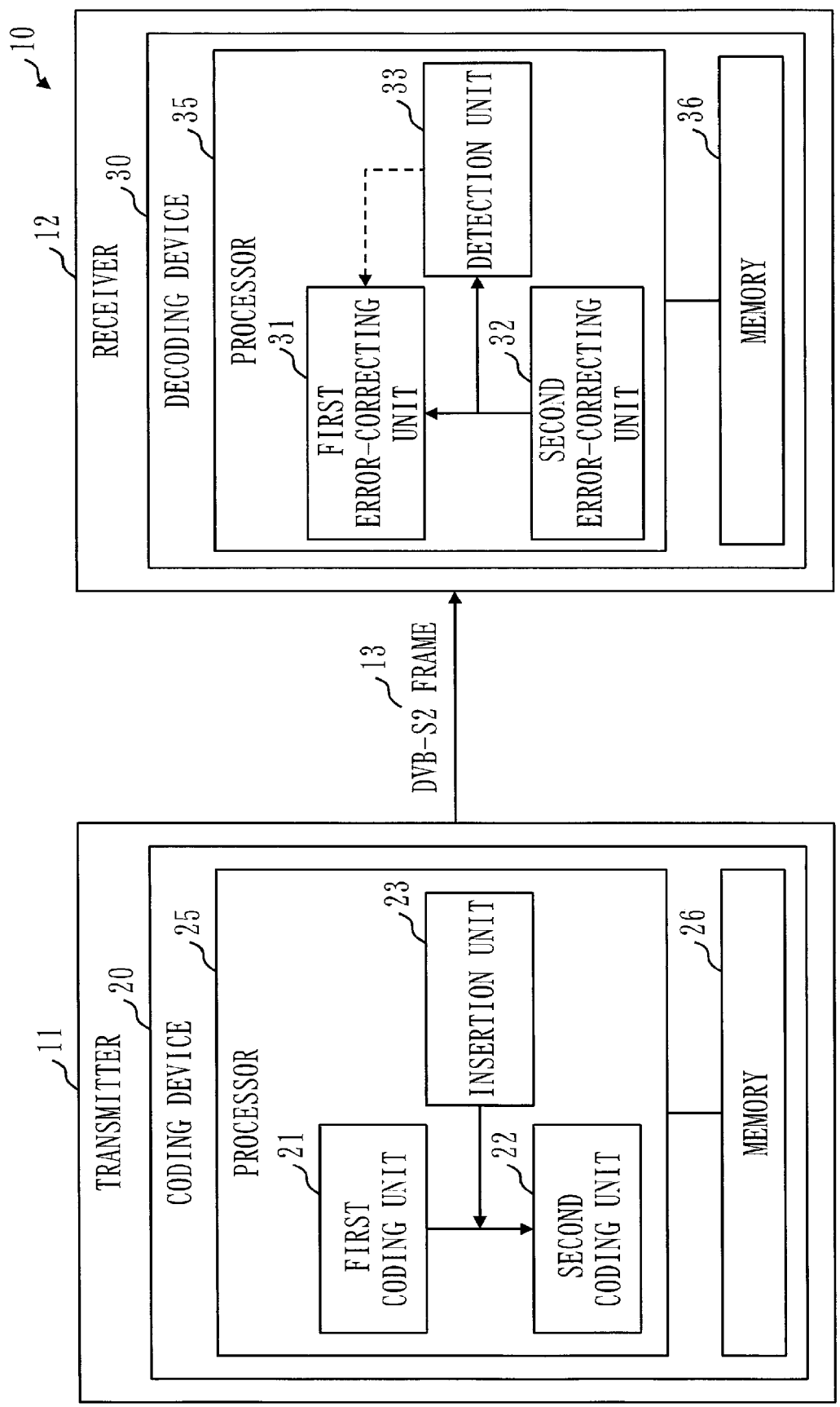
FIG. 6 is a block diagram illustrating a configuration of a communication system according to a modification of Embodiment 1.

A configuration of a communication system 10 according to a modification of the present embodiment will be described with referring to FIG. 6.

A coding device 20 is a computer. The coding device 20 is provided with hardware devices such as a processor 25 and a memory 26. The processor 25 is connected to the other hardware devices via a signal line and controls the other hardware devices.

The processor 25 is a device that executes a coding program. The coding program is a program that implements functions of a first coding unit 21, second coding unit 22, and insertion unit 23. The processor 25 is, for example, a CPU or a DSP. Note that "CPU" stands for Central Processing Unit, and "DSP" stands for Digital Signal Processor.

The memory 26 is a device that stores the coding program. The memory 26 is, for example, a flash memory or a RAM. Note that "RAM" stands for Random Access Memory.

The coding program is read by the processor 25 and executed by the processor 25. Not only the coding program but also an OS is stored in the memory 26. Note that "OS" stands for Operating System. The processor 25 executes the coding program while executing the OS.

The coding program may be incorporated in the OS partly or entirely.

The coding device 20 may be provided with a plurality of processors which substitute for the processor 25. The plurality of processors share execution of the coding program. Each processor is, for example, a CPU or a DSP.

Data, information, a signal value, and a variable value which are utilized, processed, or outputted by the coding program are stored in the memory 26, or a register or cache memory in the processor 25.

The coding program is a program that causes the computer to execute a process performed by the first coding unit 21, a process performed by the second coding unit 22, and a process performed by the insertion unit 23, as a first coding process, a second coding process, and an inserting process, respectively. Alternatively, the coding program is a program that causes the computer to execute a procedure performed by the first coding unit 21, a procedure performed by the second coding unit 22, and a procedure performed by the insertion unit 23, as a first coding procedure, a second coding procedure, and an inserting procedure, respectively. The coding program may be recorded in a computer-readable medium and provided in the form of the computer-readable medium, may be stored in a recording medium and provided in the form of the recording medium, or may be provided in the form of a program product.

A decoding device 30 also is a computer. The decoding device 30 is provided with hardware devices such as a processor 35 and a memory 36. The processor 35 is connected to the other hardware devices via a signal line and controls the other hardware devices.

The processor 35 is a device that executes a decoding program. The decoding program is a program that implements functions of a first error-correcting unit 31, second error-correcting unit 32, and detection unit 33. The processor 35 is, for example, a CPU or a DSP.

The memory 36 is a device that stores the decoding program. The memory 36 is, for example, a flash memory or a RAM.

The decoding program is read by the processor 35 and executed by the processor 35. Not only the decoding program but also an OS is stored in the memory 36. The processor 35 executes the decoding program while executing the OS.

The decoding program may be incorporated in the OS partly or entirely.

The decoding device 30 may be provided with a plurality of processors which substitute for the processor 35. The plurality of processors share execution of the decoding program. Each processor is, for example, a CPU or a DSP.

Data, information, a signal value, and a variable value which are utilized, processed, or outputted by the decoding program are stored in the memory 36, or a register or cache memory in the processor 35.

The decoding program is a program that causes the computer to execute a process performed by the first error-correcting unit 31, a process performed by the second error-correcting unit 32, and a process performed by the detection unit 33, as a first error-correcting process, a second error-correcting process, and a detecting process, respectively. Alternatively, the decoding program is a program that causes the computer to execute a procedure performed by the first error-correcting unit 31, a procedure performed by the second error-correcting unit 32, and a procedure performed by the detection unit 33, as a first error-correcting procedure, a second error-correcting procedure, and a detecting procedure, respectively. The decoding program may be recorded in a computer-readable medium and provided in the form of the computer-readable medium, may be stored in a recording medium and provided in the form of the recording medium, or may be provided in the form of a program product.

As another modification, the functions of the first coding unit 21, second coding unit 22, and insertion unit 23 of the coding device 20 may be implemented by a combination of software and hardware. That is, some of the functions of the first coding unit 21, second coding unit 22, and insertion unit 23 may be implemented by dedicated hardware, and the remaining functions may be implemented by software. Also, the functions of the first error-correcting unit 31, second error-correcting unit 32, and detection unit 33 of the decoding device 30 may be implemented by a combination of software and hardware. That is, some of the functions of the first error-correcting unit 31, second error-correcting unit 32, and detection unit 33 may be implemented by dedicated hardware, and the remaining functions may be implemented by software.

The electronic circuit 24, the processor 25, the electronic circuit 34, and the processor 35 are processing circuitry. That is, whether the configuration of the coding device 20 may be a configuration illustrated in FIG. 1 or FIG. 6, behaviors of the first coding unit 21, second coding unit 22, and insertion unit 23 are performed by the processing circuitry. Whether the configuration of the decoding device 30 may be a configuration illustrated in FIG. 1 or FIG. 6, behaviors of the first error-correcting unit 31, second error-correcting unit 32, and detection unit 33 are performed by the processing circuitry.

Embodiment 2

The present embodiment will be described mainly regarding its difference from Embodiment 1 with referring to FIG. 7.

In Embodiment 1, the RS code in which one symbol is 1 octet is used, and the quantity of codes to be divided is adapted to the size K of the user data field 67 of the DVB-S2 frame 13. Then, even if an error remains in one DVB-S2 frame 13, correction is guaranteed. Applying this to a wider range, as a method that corrects an error in consecutive DVB-S2 frames 13, a method is available which performs division using more than K of codes. In the DVB-S2 frame 13, the size K of the user data field 67 of the DVB-S2 frame 13 differs according to the coding rate of the LDPC code. Therefore, it is possible to set the quantity of codes to a fixed quantity L, considering the maximum user data length of the DVB-S2 frames 13, without being influenced by the coding rate of the LDPC code.

In Embodiment 1, the RS code, in which one symbol is 1 octet, has a maximum code length of 255 symbols. It is also possible to add an expanded parity, thereby increasing the maximum code length to 256 symbols. This is, however, the limit of the RS code. To further enhance the coding rate, the symbol of the RS code must have a size of 1 octet or more. The data length of the user data field 67 of the DVB-S2 frame 13 is given in units of octets. If the size of one symbol is given in units of other than 1 octet, there is no guarantee that the DVB-S2 frame 13 can be just contained in the user data field 67.

Figure 7:
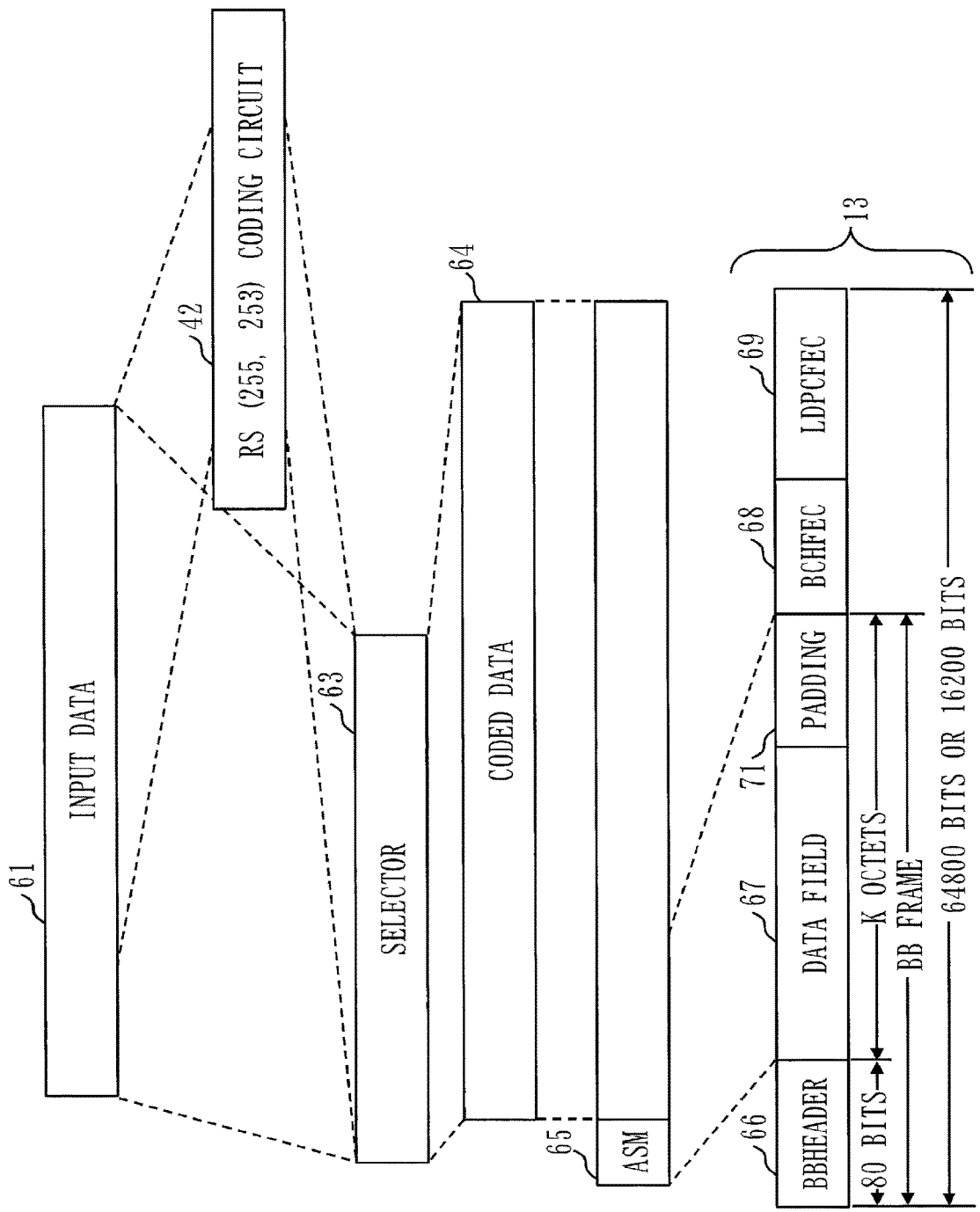
FIG. 7 is a diagram illustrating a flow of processing executed by a coding device according to Embodiment 2 and a configuration of an obtained frame.

As illustrated in FIG. 7, in the present embodiment, a padding 71 is inserted in a DVB-S2 frame 13. Therefore, even if the symbol of the RS code is given in units of other than 1 octet, the data length of a user data field 67 can be adapted to the size of the symbol of the RS code by adjusting the padding length.

An ASM for synchronizing coded data 64 is also inserted. Accordingly, the size of the symbol of the RS code is desirably a divisor of the ASM.

As illustrated in FIG. 7, in the present embodiment, a first coding unit 21 generates a parity of the RS code by coding, based on the RS code, first data sequences which are in a quantity larger than a quantity that matches a length of the user data field 67 of one DVB-S2 frame 13. The first coding unit 21 inserts each data sequence existing in a row direction of the coded data 64, in the user data field 67 of each DVB-S2 frame 13, and fills a remaining portion of the user data field 67 of each DVB-S2 frame 13 with the padding 71.

Embodiment 3

The present embodiment will be described mainly regarding its difference from Embodiment 1 with referring to FIGS. 8 and 9.

In Embodiment 1, decoding using the first error-correcting code is performed in accordance with ordinary decoding which calculates an error-correcting position and its size. In the present embodiment, erasure correction is performed in cooperation with a BCH code which is an outer code of the DVB-S2 frame 13.

Figure 8:
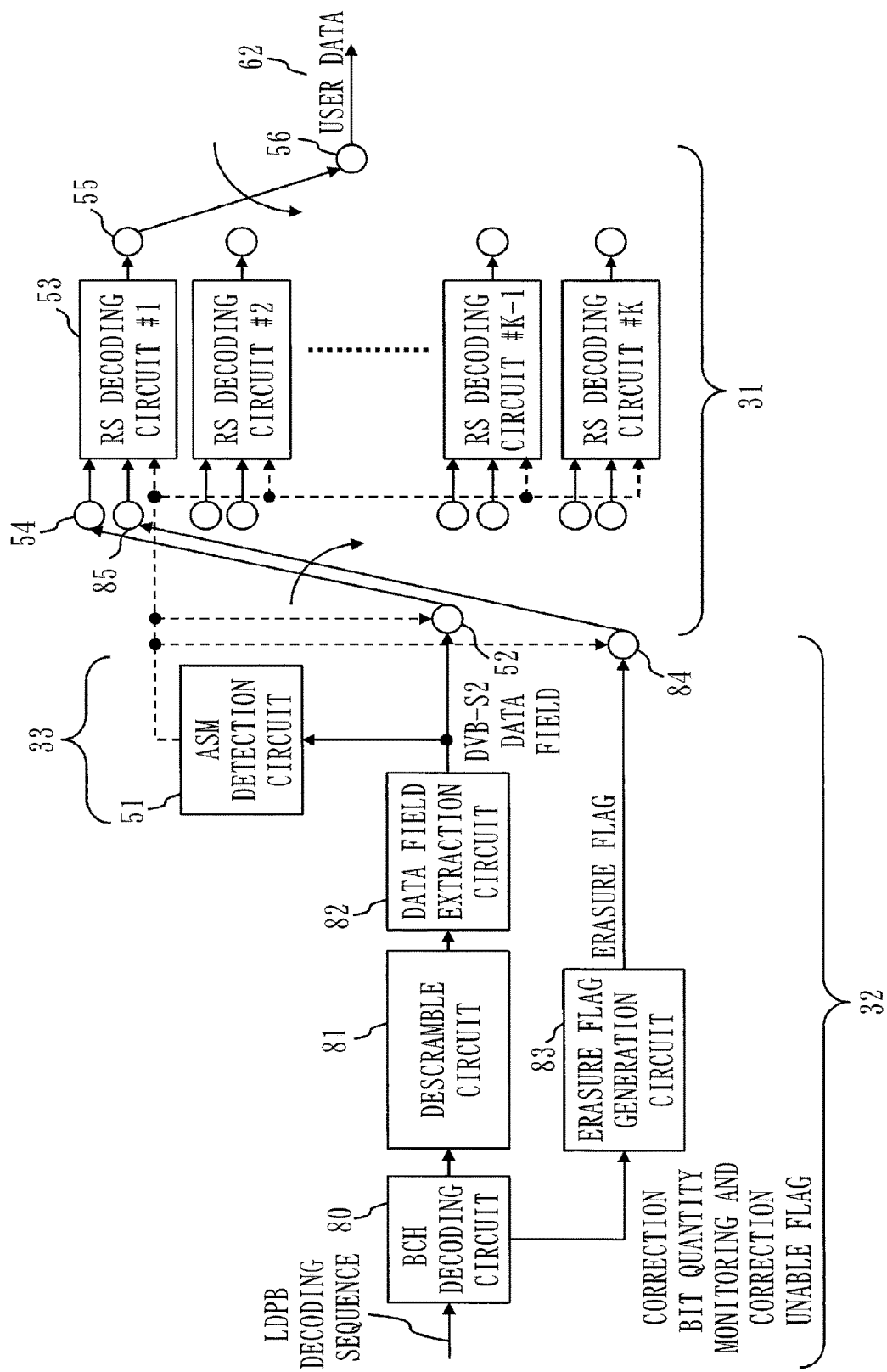
FIG. 8 is a block diagram illustrating a configuration example of part of a decoding device according to Embodiment 3.

FIG. 8 illustrates a configuration example of a first error-correcting unit 31, second error-correcting unit 32, and detection unit 33 of a decoding device 30.

In the present example, the second error-correcting unit 32 is provided with a BCH decoding circuit 80, a descramble circuit 81, and a DATA FIELD extraction circuit 82 which extracts a user data field 67 of a DVB-S2 frame 13. Output from the DATA FIELD extraction circuit 82 is inputted to an ASM detection circuit 51 and an input terminal 52.

The second error-correcting unit 32 is provided with an erasure flag generation circuit 83, an output terminal 84 of the erasure flag generation circuit 83, and an erasure flag input terminal 85 of an RS decoding circuit 53, as constituent elements for erasure correction.

The erasure flag generation circuit 83 performs erasure determination of the user data field 67 of the DVB-S2 frame 13 based on correction bit quantity monitoring and an correction-unable flag which are obtained from the BCH decoding circuit 80 for each DVB-S2 frame 13. A result of the erasure determination is inputted to the erasure flag input terminal 85 as an erasure flag via the output terminal 84. RS decoding circuits 53 have an erasure correction processing function.

Behavior of detecting a top of a block of input data 61 on the coding side from the user data field 67 of the DVB-S2 frame 13 by the ASM detection circuit 51 and initialization of input to the RS decoding circuits 53 are the same as those of Embodiment 1. The erasure flag generation circuit 83 generates an erasure flag of a symbol of the RS code related to the user data field 67, from a quantity of corrections or a correction-unable flag obtained by the BCH decoding circuit 80 in BCH decoding in units of user data fields 67 of the DVB-S2 frame 13, and outputs the generated erasure flag.

Normally, the erasure flag generation circuit 83 may generate an erasure flag upon reception of a correction-unable flag from the BCH decoding circuit 80. When, however, a large residual bit error occurs in decoding using the LDPC code, there is a possibility that incorrect correction occurs in the BCH decoding circuit 80. In erasure correction, if an error due to incorrect correction is overlooked, a possibility that correction cannot be performed correctly may increase. For this reason, an erasure flag may be set up also in a case where a quantity of correction bits being the maximum correction capability, at which a probability of occurrence of incorrect correction is high, or a similar quantity of correction bits, is detected. In the present example, connection from the output terminal 84 to the erasure flag input terminal 85 of the RS decoding circuit 53 is made in synchronism with an RS code symbol.

In the present embodiment, only one symbol or less of each RS code sequence is allocated to the user data field 67 of one DVB-S2 frame 13, just as in Embodiment 1. Hence, even if erasure is determined regarding the user data field 67 of one DVB-S2 frame 13, this erasure merely appears as an erasure of as small as one symbol from the viewpoint of the RS code sequence.

The RS decoding circuit 53 performs identification of an erasure position along with syndrome computation using an inputted RS code symbol. FIG. 9 illustrates an example of an erasure correction method in the RS decoding circuit 53. Assume that a code symbol length and an information symbol length of an RS code are the same as those in the example of Embodiment 1, and that a generating polynomial G (X) of the RS code is given as G (X)=(X−1)(X−α) where α is a primitive element. With this RS signal, a maximum of two erasure corrections is possible.

Syndrome calculation is performed in the same manner as in a conventional error correction method. An element over a Galois field is also generated by an inputted erasure flag to correspond to an input order. Note that αi is an element over the Galois field and indicates an erasure position i, and that αj is an element over the Galois field and indicates an erasure position j.

At a time point at which two syndromes S0 and S1 are obtained, if the syndromes S0 and S1 are both 0, the first error-correcting unit 31 determines that there is no error, where S0 is a residue of (X−1) and S1 is a residue of (X−α). This is because even if erasures occur, a possibility that an error occurs entirely is generally small from the viewpoint of the corresponding RS code sequence, and in many cases, symbols with no errors have been inputted.

As a next process, the first error-correcting unit 31 determines a quantity of erasure symbols. When there is one erasure symbol, the first error-correcting unit 31 performs correction by determining S0 as an error pattern at an erasure position. If S0 is 0 and S1 is non-0, or if S0 is non-0 and S1 is 0, the first error-correcting unit 31 can determine that a correction-unable error occurs. Even when S1/S0, that is, a result of division over the Galois field, does not coincide with an element over the Galois field indicating an erasure position, in a case of one erasure, the first error-correcting unit 31 can determine that a correction-unable error occurs. In FIG. 9, Ei represents an erasure pattern at an erasure position i, and Ej represents an erasure pattern at an erasure position j.

When there are two erasure symbols, error patterns of two erasure positions are obtained immediately from S0 and S1 using addition, multiplication, and division over the Galois field. In this case, even if S0 is 0 and S1 is non-0, as far as the error patterns at the two erasure positions are the same, the first error-correcting unit 31 determines that the two erasure errors have the same pattern. If S0 is non-0 and S1 is 0, error patterns at erasure positions are also obtained.

When there are three erasure symbols or more, the first error-correcting unit 31 performs ordinary one-symbol-error correction. Verification for one erasure symbol can be applied with no change, and thus may be utilized. By checking whether an obtained error position is one of erasure symbol positions, a BCH decoding result with DVB-S2 is reflected, so that correction reliability can be improved. In FIG. 9, Ek=S0 and αk=S1/S0. Whether αk is an erasure position is confirmed.

As described above, in decoding the first error-correcting code, if correction bit quantity monitoring and the correction-unable flag from the BCH decoding circuit 80 are used, erasure correction can be performed relatively easily with low-delay processing without using another error detection code such as CRC. Regarding errors remaining in the DVB-S2 frame 13, errors in the DVB-S2 frame 13 can be corrected twice as much than in ordinary error correction.

With two erasure corrections, a method of checking whether correction is right is not available unlike with one erasure correction. Therefore, in the one-symbol-1-octet RS code having 255 symbols, being the maximum symbol length, the parity can be increased by one, and one of the parities can be used for checking erasure correction. Alternatively, a 256-symbol expanded RS code, to which an even parity of an RS code sequence has been added, can be employed and used for checking erasure correction. An expanded parity of an expanded RS code can be used for checking in ordinary error correction as well. Inversely, if one erasure correction suffices, only an even or odd parity needs to be added. Needless to say, this also applies to a case where the symbol length is other than 1 octet.

Figure 9:
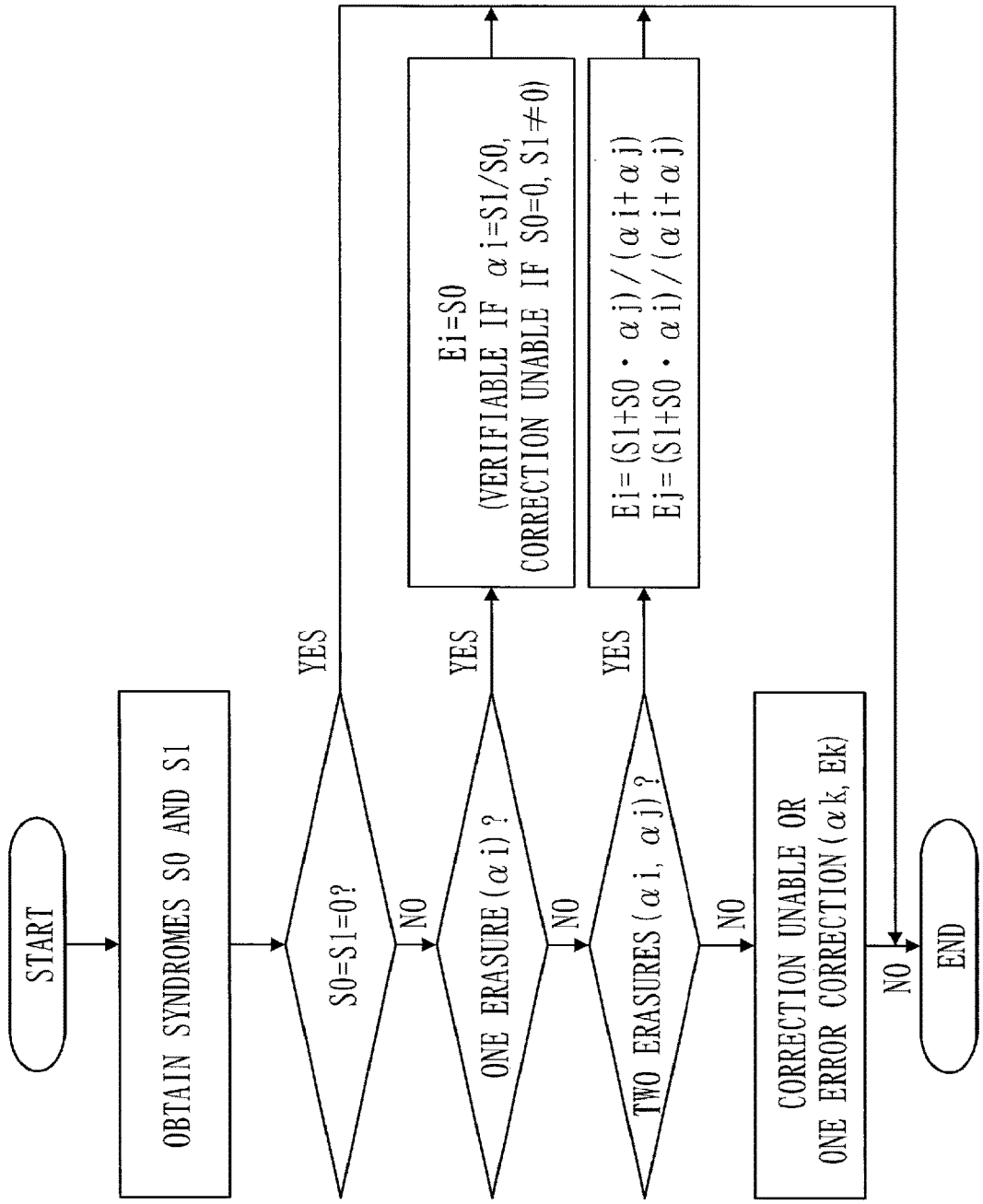
FIG. 9 is a flowchart illustrating a flow of processing executed by the decoding device according to Embodiment 3.

As illustrated in FIGS. 8 and 9, in the present embodiment, the first error-correcting unit 31 performs, as error correction using a parity of an RS code, erasure correction on each first data sequence based on a result of error correction performed by the second error-correcting unit 32.

Specifically, in decoding using a BCH code which is an outer code of the DVB-S2 frame 13, the first error-correcting unit 31 determines, including correction-unable determination, erasure of a bit sequence in the DVB-S2 frame 13 in accordance with a quantity of correction bits.

Embodiment 4

The present embodiment will be described mainly regarding its difference from Embodiment 1 with referring to FIGS. 10 and 11.

In Embodiment 1, the ASM, being a sync pattern of the coded data 64, is attached only to the head of the block of the coded data 64. When the block of the coded data 64 is large, synchronization of the block may take time. In the present embodiment, in order to achieve synchronization in a shorter period of time, ASMs being sync patterns are inserted at equal, short intervals that do not increase the overhead excessively. With the plurality of ASMs being located in the coded data 64, at least the head of the coded data 64 must be reliably recognizable.

Figure 4:
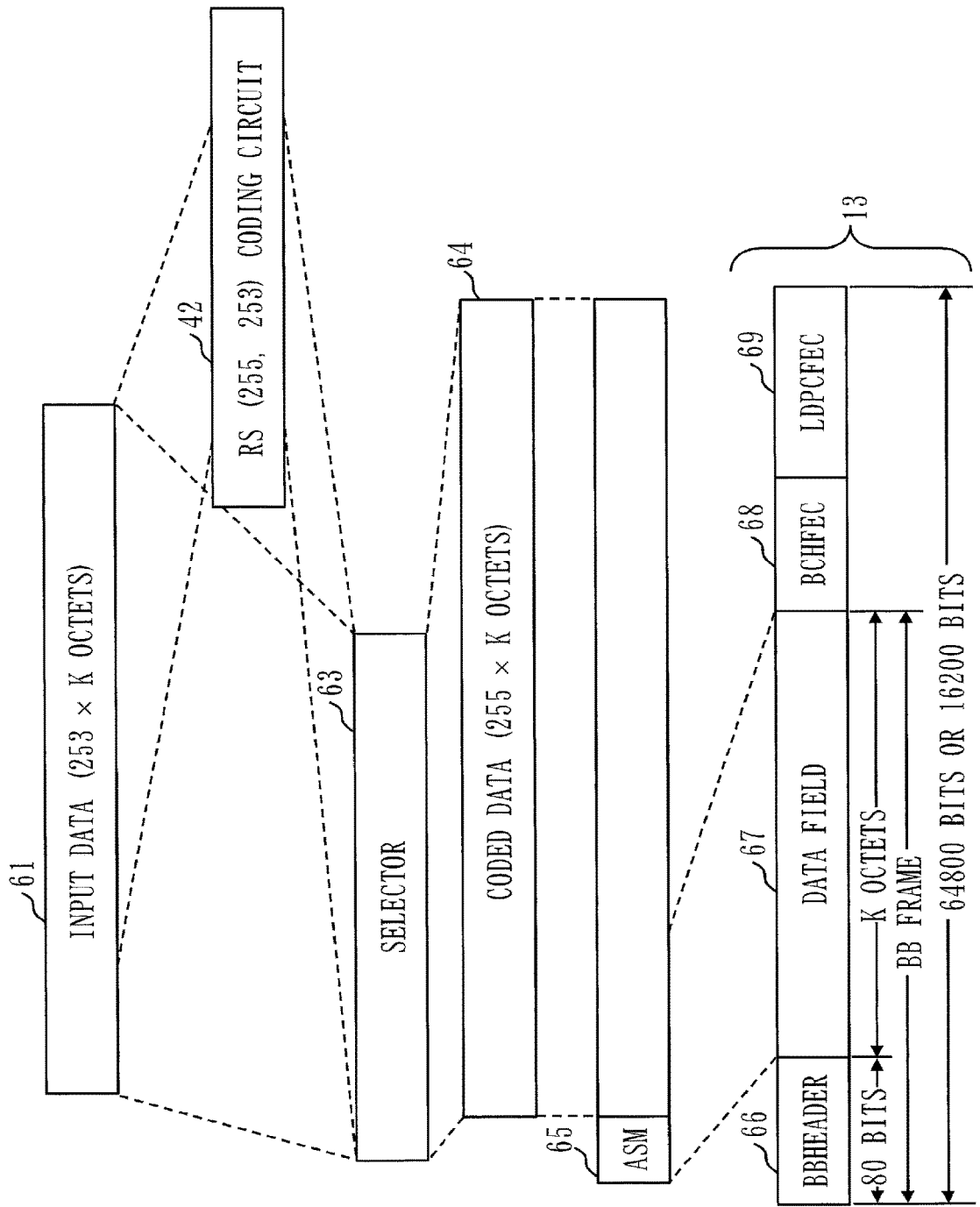
FIG. 4 is a diagram illustrating a flow of processing executed by the coding device according to Embodiment 1 and a configuration of an obtained frame.
Figure 10:
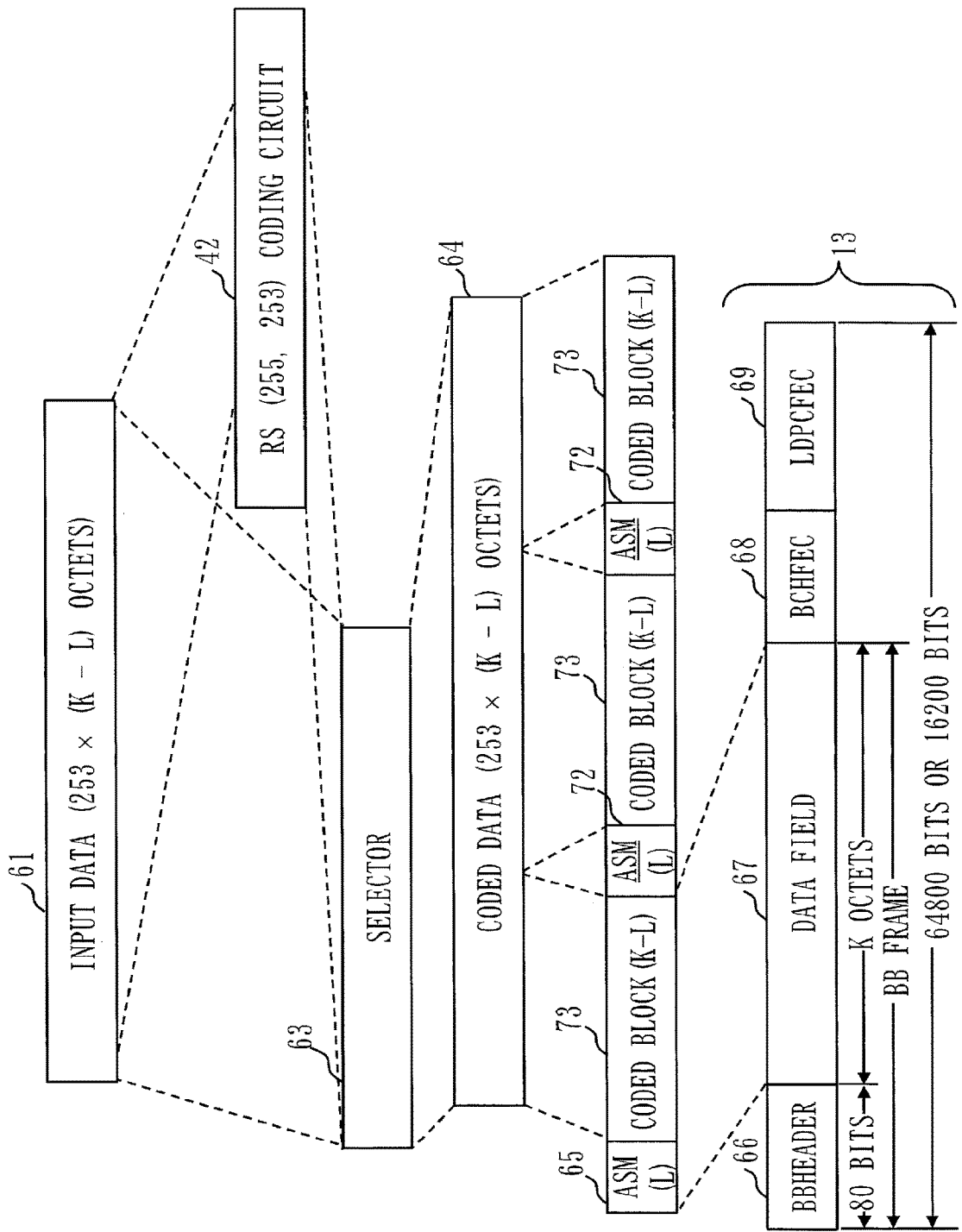
FIG. 10 is a diagram illustrating a flow of processing executed by a coding device according to Embodiment 4 and a configuration of an obtained frame.

As illustrated in FIG. 10, in the present embodiment, a block of input data 61 has 253×(K−L) octets, so the block is slightly smaller than that illustrated in FIG. 4. The (K−L) of parallel RS coding circuits 42 generate a parity of an RS code each time they code one block of the input data 61. A selector 63 selectively outputs the input data 61 and the parity of the RS code. Hence, interleaved coded data 64 having 255×(K−L) octets is obtained. The coded data 64 is divided into a plurality of coded blocks 73 in units of (K−L) octets. An identifier 65, being a sync signal, for identifying the coded block 73 at the top of the coded data 64 is attached to the coded block 73 at the top. Identifiers 72, being sync signals, for identifying the coded blocks 73 other than the coded block 73 at the top of the coded data 64 are attached to the other coded blocks 73. Each identifier 72, corresponding to an ASM indicated in Non-Patent Literature 2, has a pattern different from that of the identifier 65 at the top. The identifier 72 is, for example, inverted data of the identifier 65. The coded data 64, to which the identifier 65 is attached and in which the identifiers 72 are inserted between the coded blocks 73, is inserted in a user data field 67 "DATA FIELD" of a DVB-S2 frame 13 in units of K octets.

In the present embodiment, the behavior until generation of the coded data 64 is the same as that of Embodiment 1, except that the quantity of parallel RS coding circuits 42, a block length of the input data 61, and a size of the coded data 64 are different. By inserting the identifiers 72, synchronization on the decoding side can be accelerated. The identifier 65 and each identifier 72 both have an L octet length, and each coded block 73 has a (K−L) octet length. Hence, the sum lengths of the identifier 65 or identifiers 72 and the corresponding coded blocks 73 are uniformed to K octets, which is the same as the length of the user data field 67 of the DVB-S2 frame 13. Therefore, even when errors remain in one DVB-S2 frame 13 entirely, they appear as an error of as small as 1 symbol, that is, an error of 1 octet, from the viewpoint of the RS code sequence.

Figure 11:
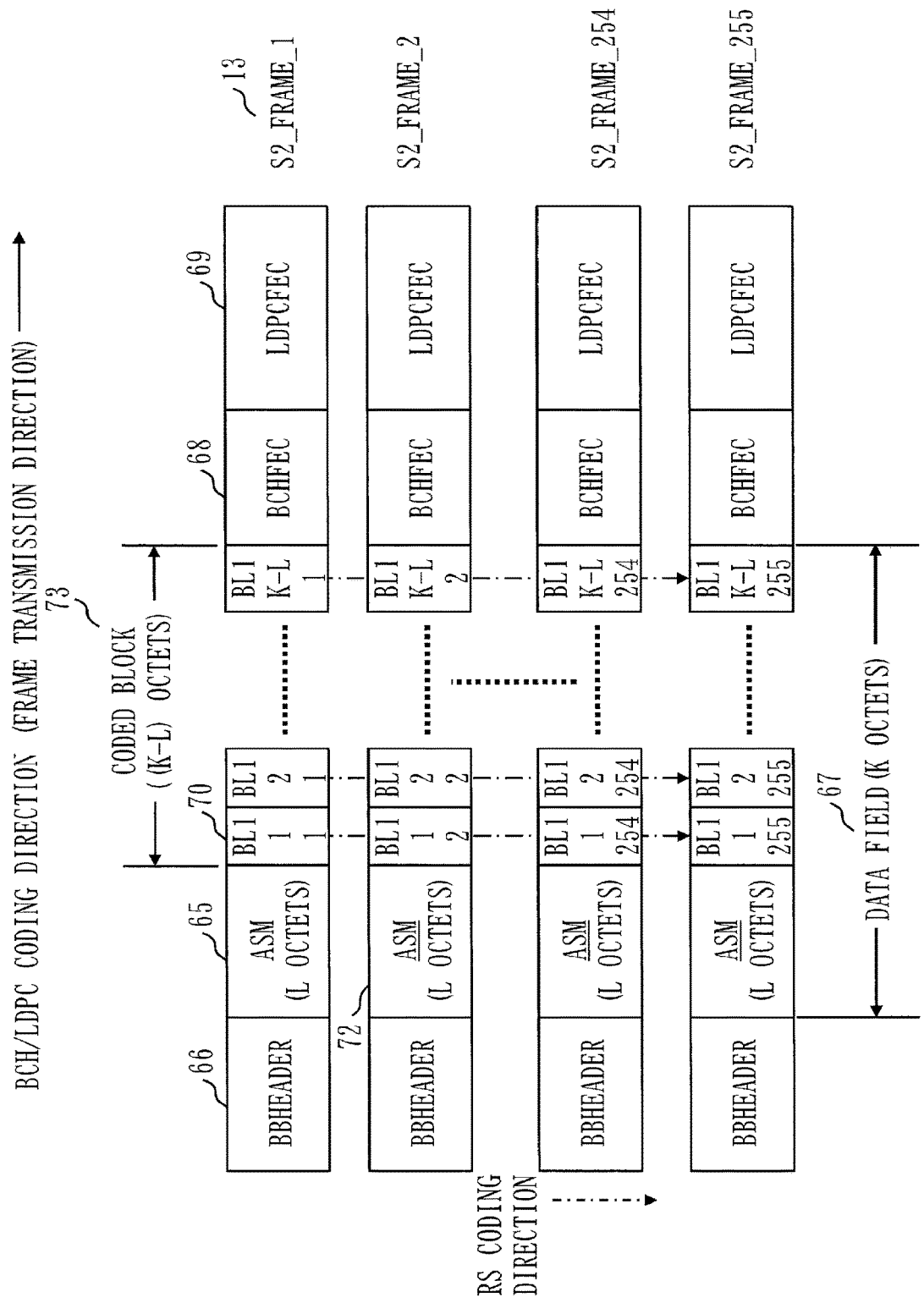
FIG. 11 is a diagram illustrating an example of allocating coded data to frames according to Embodiment 4.

FIG. 11 illustrates an example of allocating the coded data 64 to the DVB-S2 frames 13.

In the present example, an ASM corresponding to the identifier 65 or identifier 72 is placed at the top of the user data field 67 of each DVB-S2 frame 13. When this layout is employed, all erasure positions of (K−L) of RS code sequences become the same. Hence, in the decoding process, some process such as Galois field conversion from an erasure position can be shared.

If some of the ASMs to be inserted have patterns that are different from each other, a frame in which an error supposedly remains after BCH decoding can be identified for each DVB-S2 frame 13. Hence, identification of an erasure position in units of frames or a re-transmission request in units of frames is possible.

As illustrated particularly in FIG. 11, in the present embodiment, an insertion unit 23 inserts identifiers for discriminating the top of the input data 61 and a portion of the input data 61 other than the top, in the coded data 64 in units of data transmission, starting from the top of the coded data 64. That is, the insertion unit 23 inserts an identifier for discriminating the top of the coded data 64 and a portion of the coded data 64 other than the top, in the top of each row of the coded data 64.

A second coding unit 22 divides the coded data 64 including the identifiers inserted by the insertion unit 23, into a plurality of second data sequences. Hence, each second data sequence exists in the row direction of the coded data 64 which is generated by a first coding unit 21 and in which the identifiers are inserted by the insertion unit 23.

Embodiment 5

The present embodiment will be described mainly regarding its difference from Embodiment 4 with referring to FIGS. 12 to 14.

In Embodiment 4, the ASM, being a sync signal, is inserted in the top of the user data field 67 "DATA FIELD" of each DVB-S2 frame 13. In the present embodiment, insertion of an ASM is not necessary. In order to reduce the overhead, information that replaces the ASM is inserted in the header field 66 "BBHEADER" of each DVB-S2 frame 13.

Figure 12:
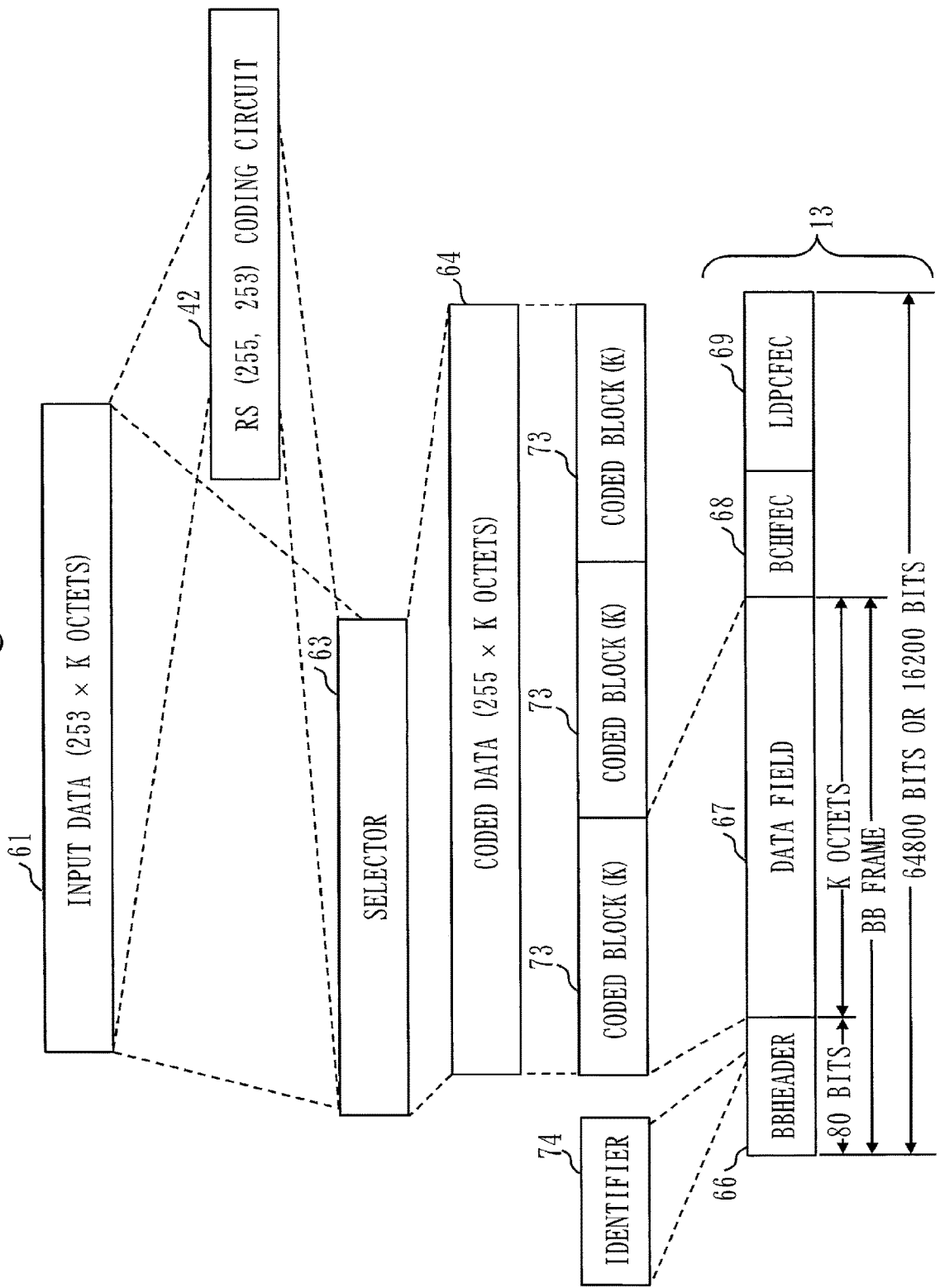
FIG. 12 is a diagram illustrating a flow of processing executed by a coding device according to Embodiment 5 and a configuration of an obtained frame.

As illustrated in FIG. 12, in the present embodiment, a block of input data 61 has 253×K octets, as in Embodiment 1. The K of parallel RS coding circuits 42 generate a parity of an RS code each time they code one block of the input data 61. A selector 63 selectively outputs the input data 61 and the parity of the RS code. Hence, interleaved coded data 64 having 255×K octets is obtained. The coded data 64 is divided into a plurality of coded blocks 73 in units of K octets. The coded data 64 is inserted in a user data field 67 of the DVB-S2 frame 13 in units of K octets, with no ASM being attached or inserted.

In the present embodiment, the behavior until generation of the coded data 64 is completely the same as that of Embodiment 1. In the present embodiment, each coded block 73 is always placed at the top of the user field 7 of each DVB-S2 frame. An identifier 74, being a sync signal indicating the top of the coded data 64 and being information that replaces the ASM, is put into a header field 66 "BBHEADER", being a field for control information of DVB-S2.

Figure 13:
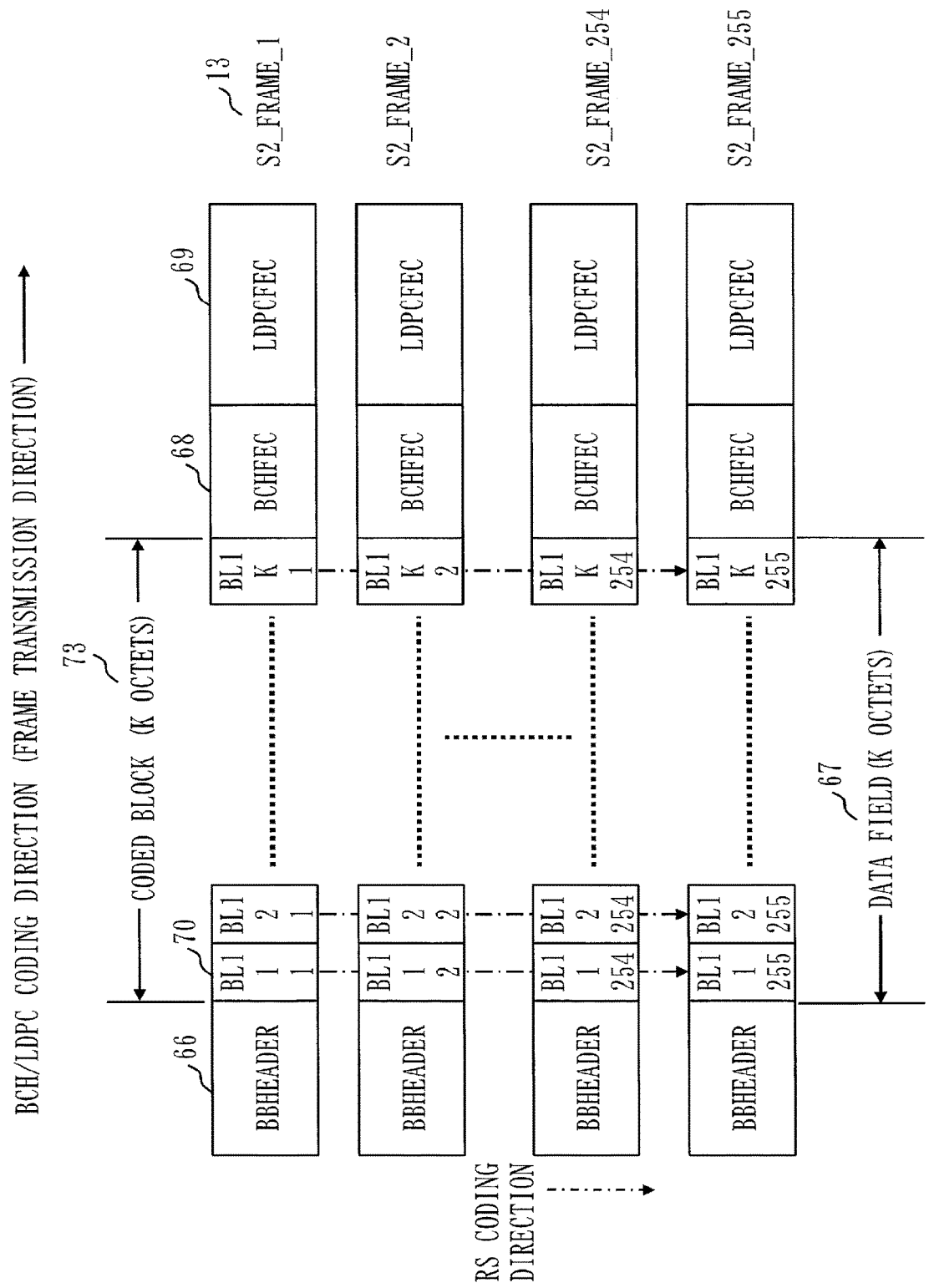
FIG. 13 is a diagram illustrating an example of allocating coded data to frames according to Embodiment 5.

FIG. 13 illustrates an example of allocating the coded data 64 to DVB-S2 frames 13.

In the present example, the same RS code sequences are placed at the same positions of the user data fields 67 of the DVB-S2 frames 13.

As in Embodiment 1, an RS code having a 255 octet code length and a 253 octet information length is used where 1 octet is one symbol. Therefore, a user data field 67 of a 254th DVB-S2 frame 13 and a user data field 67 of a 255th DVB-S2 frame 13 are each constituted only of parities of the RS codes.

As in Embodiment 2, when a padding 71 is also used, an RS code in which one symbol is larger than 1 octet can be used. This can increase the code length of the RS code.

As in Embodiment 3, erasure correction may be performed.

Figure 14:
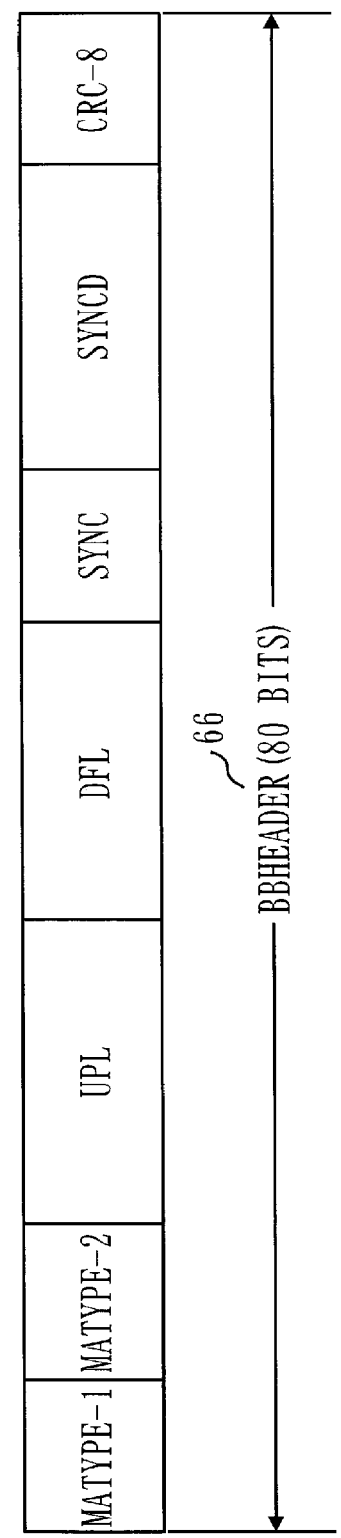
FIG. 14 is a diagram illustrating a configuration of a header field of the frame according to Embodiment 5.

A candidate for a position where the identifier 74 is to be put is, for example, "MATYPE-2" or "SYNCD" in the header field 66 illustrated in FIG. 14.

Non-Patent Literature 1 indicates that with single input, "MATYPE-2" is reserved. "MATYPE-2" has 8 bits. Hence, with single input, the identifier 74 can be put in "MATYPE-2".

In a Continuous Generic Streams mode where pieces of data are inputted consecutively, "SYNCD" is also reserved, so that the identifier 74 can be put in "SYNCD". "SYNCD" has 16 bits.

Alternatively, if the identifier 74 is put in "MATYPE-2" and the block number, such as "BL1", of the coded data 64 is inserted in "SYNCD", ARQ can be performed for each coded data 64.

As described above in the present embodiment, the frame is constituted by synchronizing the DVB-S2 frame 13 and the first error-correcting code. Hence, errors remaining in the DVB-S2 frame 13 can be corrected efficiently while reducing the overhead, so that higher performance can be achieved.

As illustrated particularly in FIG. 12, in the present embodiment, an insertion unit 23 inserts, in the header field 66 of each DVB-S2 frame 13, the identifier 74 for identifying whether the top of the coded data 64 is included in each DVB-S2 frame 13.

Embodiment 6

Figure 15:
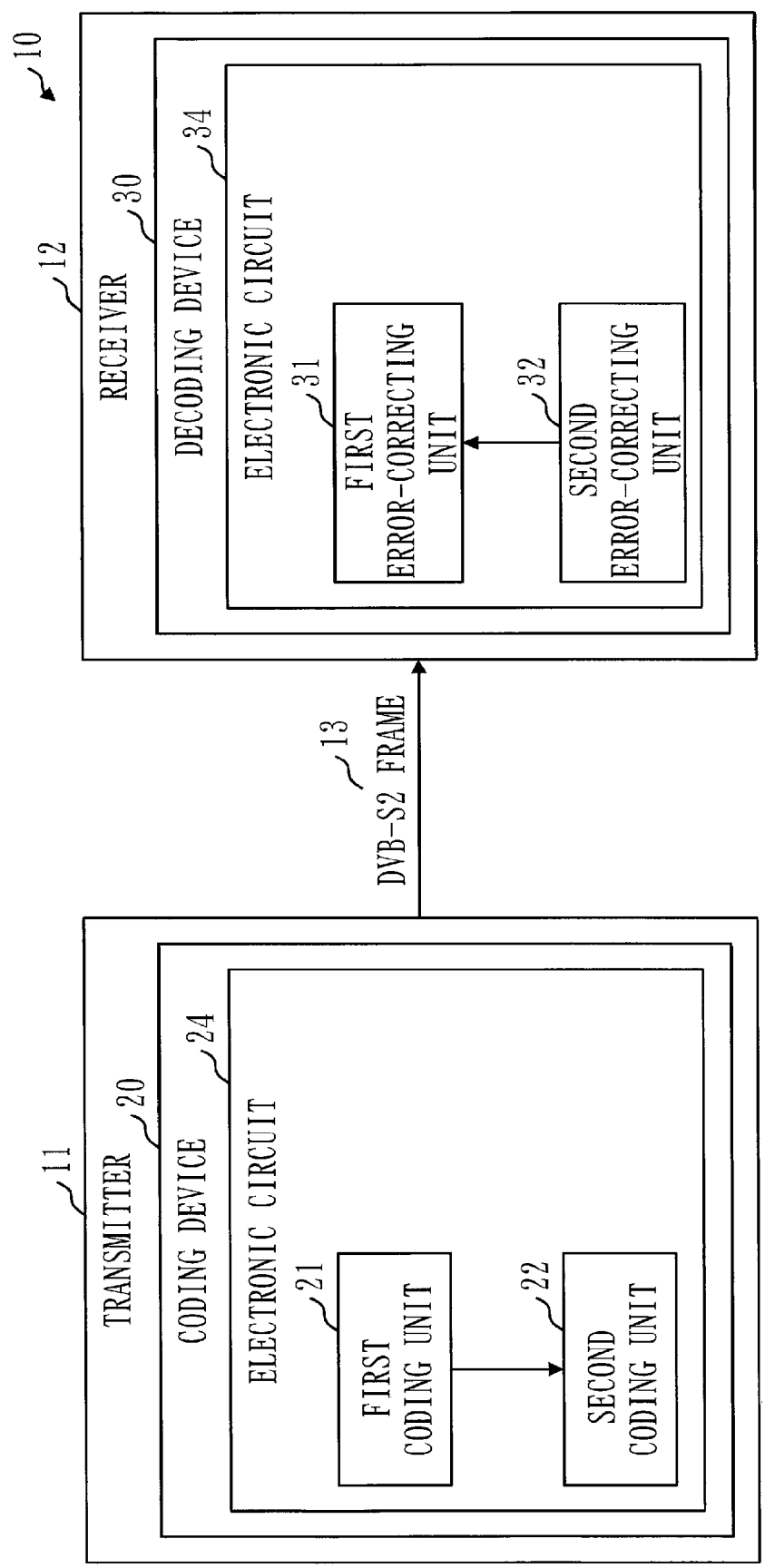
FIG. 15 is a block diagram illustrating a configuration of a communication system according to Embodiment 6.

The present embodiment will be described mainly regarding its difference from Embodiment 1 with referring to FIGS. 15 and 16.

In Embodiments 1, 2, 4, and 5, a plurality of RS code sequences are formed into one block of coded data 64. A sync signal that identifies at least the top of the block is added to the block. Then, a resultant block is divided among the user data fields 67 of the DVB-S2 frame 13. Therefore, even when errors remain in one DVB-S2 frame 13 entirely, they appear as an error of as small as one symbol, that is, an error of 1 octet, from the viewpoint of the RS code sequence. The present embodiment employs a configuration that when the DVB-S2 frames 13 are transmitted consecutively, the same effect is obtained without a sync signal. Hence, in the present embodiment, the insertion unit 23 of the coding device 20 can be omitted, as illustrated in FIG. 15. The detection unit 33 of the decoding device 30 can also be omitted.

In the present embodiment, as in Embodiment 1, an RS code having a 255 octet code length and a 253 octet information length is used where 1 octet is one symbol. In Embodiment 1, parities of the RS codes being the first error-correcting codes are concentrated on a specific DVB-S2 frame 13. In the present embodiment, the parities of the RS codes being the first error-correcting codes are allocated to the individual DVB-S2 frames 13.

FIG. 16 illustrates an example of allocating coded data 64 to DVB-S2 frames 13.

In the present example, a K octet user data field 67 "FSYS GIRLF" is divided into 255 of small blocks 70 equivalent to a code length of an RS code. The residue after division by 255 which is the code length of the RS code is used as a padding 71.

In respect of a coded block 73 including the 255 of small blocks 70 of each DVB-S2 frame 13, an RS code sequence is a sequence of small blocks 70 lining up in an oblique direction across the DVB-S2 frames 13 being transmitted sequentially. The parity of the RS code sequence that starts from the small block 70 at the top of the top frame is inserted in the last small block 70 of the 255th frame. Note that the sequence of the small blocks 70 may be constituted of a plurality of RS code sequences.

As described above, the user data field 67 of the DVB-S2 frame 13 is divided into small blocks 70 in a quantity that matches an RS code length. Each RS code sequence is allocated to a small block 70 located at a position that differs from one DVB-S2 frame 13 to another. Then, there is no need to attach information that represents the top position of the RS code sequence. In the present embodiment, even when errors remain in the entire user data field 67 of one DVB-S2 frame 13, they can be divided so that they appear merely as a one-symbol error, that is, a 1 octet error from the viewpoint of the RS code sequence.

As in Embodiment 2, when the padding 71 is used, an RS code in which one symbol is larger than 1 octet can be used. This can increase the code length of the RS code.

As in Embodiment 3, erasure correction may be performed.

As illustrated particularly in FIG. 16, in the present embodiment, each first data sequence exists in an oblique direction of input data 61. A first coding unit 21 generates the parity of the RS code by coding, based on the RS code, the first data sequences which are in a quantity that matches a length of each first data sequence. The first coding unit 21 generates the coded data 64 by attaching the parity of the RS code to each first data sequence, thereby consequently expanding the matrix in the oblique direction.

REFERENCE SIGNS LIST

10: communication system; 11: transmitter; 12: receiver; 13: DVB-S2 frame; 20: coding device; 21: first coding unit; 22: second coding unit; 23: insertion unit; 24: electronic circuit; 25: processor; 26: memory; 30: decoding device; 31: first error-correcting unit; 32: second error-correcting unit; 33: detection unit; 34: electronic circuit; 35: processor; 36: memory; 41: input terminal; 42: RS coding circuit; 43: input terminal; 44: output terminal; 45: connection terminal; 46: connection terminal; 47: connection terminal; 48: ASM generation circuit; 49: output terminal; 50: output terminal; 51: ASM detection circuit; 52: input terminal; 53: RS decoding circuit; 54: input terminal; 55: output terminal; 56: output terminal; 61: input data; 62: user data; 63: selector; 64: coded data; 65: identifier; 66: header field; 67: user data field; 68: parity field; 69: parity field; 70: small block; 71: padding; 72: identifier; 73: coded block; 74: identifier; 80: BCH decoding circuit; 81: descramble circuit; 82: DATA FIELD extraction circuit; 83: erasure flag generation circuit; 84: output terminal; 85: erasure flag input terminal.

The invention claimed is:

1. A coding device comprising:
   processing circuitry configured to:
   generate a parity of a first error-correcting code by coding, based on the first error-correcting code, each first data sequence existing in a direction different from a row direction of input data regarded as one matrix, and generate coded data by attaching the parity of the first error-correcting code to each first data sequence, thereby consequently expanding the matrix;
   generate a parity of a second error-correcting code by coding, based on the second error-correcting code, each second data sequence existing in a row direction of the generated coded data, and generate a plurality of frames including, per frame, one data sequence existing in the row direction of the coded data, and a corresponding parity of the second error-correcting code; and
   insert an identifier for identifying a top of the coded data in a first row of the coded data.

2. The coding device according to claim 1,
   wherein a data element existing in each row of each first data sequence has a data length of one symbol or less.

3. The coding device according to claim 1,
   wherein each first data sequence exists in a column direction of the input data, and
   wherein the processing circuitry is further configured to generate the coded data and consequently expand the matrix in the column direction.

4. The coding device according to claim 1,
   wherein inserting the identifier for identifying the top of the coded data in the first row of the coded data shifts the matrix, and
   wherein each second data sequence exists in the row direction of the generated coded data in which the identifier is inserted.

5. The coding device according to claim 1,
wherein the processing circuitry is further configured to insert, in a header field of each frame, an identifier for identifying whether the top of the coded data in the first row of the coded data is included in each frame.

6. The coding device according to claim 1,
wherein the processing circuitry is further configured to insert identifiers for discriminating the top of the coded data in the first row of the coded data and a portion of the coded data other than the top, in a top of each row of the coded data, and
wherein each second data sequence exists in the row direction of the generated coded data in which the identifiers are inserted.

7. The coding device according to claim 1,
wherein the processing circuitry is further configured to generate the parity of the first error-correcting code by coding, based on the first error-correcting code, the first data sequences which are in a quantity that matches a length of a user data field of one frame, and insert each data sequence existing in the row direction of the coded data, in a user data field of each frame.

8. The coding device according to claim 1,
wherein the processing circuitry is further configured to generate the parity of the first error-correcting code by coding, based on the first error-correcting code, the first data sequences which are in a quantity larger than a quantity that matches a length of a user data field of one frame, insert each data sequence existing in the row direction of the coded data, in a user data field of each frame, and fill a remaining portion of the user data field of each frame with a padding.

9. The coding device according to claim 1,
wherein each first data sequence exists in an oblique direction of the input data, and
wherein the processing circuitry is further configured to generate the parity of the first error-correcting code by coding, based on the first error-correcting code, the first data sequences which are in a quantity that matches a length of each first data sequence, and generate the coded data by attaching the parity of the first error-correcting code to each first data sequence, thereby consequently expanding the matrix in the oblique direction.

10. The coding device according to claim 1,
wherein the processing circuitry is further configured to generate, as the parity of the first error-correcting code, parities of a plurality of symbols.

11. The coding device according to claim 1,
wherein the first error-correcting code is an RS code or an extended RS code.

12. The coding device according to claim 1,
wherein the second error-correcting code is a concatenated code.

13. A transmitter comprising
the coding device according to claim 1,
wherein the transmitter transmits the plurality of frames obtained from the coding device to an outside.

14. A decoding device comprising:
processing circuitry configured to:
    detect an identifier that identifies a top of a coded data in a first row of the coded data;
    obtain, based on the identifier, a plurality of frames including, per frame, one data sequence existing in a row direction of the coded data regarded as one matrix, and a corresponding parity of a second error-correcting code, and perform error correction on each second data sequence existing in the row direction of the coded data, using the parity of the second error-correcting code; and
    obtain a parity of a first error-correcting code attached to each first data sequence existing in a direction different from the row direction of the coded data on which error correction has been done, and perform error correction on each first data sequence using the parity of the first error-correcting code.

15. The decoding device according to claim 14,
wherein the processing circuitry is further configured to perform, as error correction using the parity of the first error-correcting code, erasure correction on each first data sequence based on a result of performed error correction.

16. A receiver comprising
the decoding device according to claim 14,
wherein the receiver receives the plurality of frames from an outside and supplying the plurality of frames to the decoding device.

17. The coding device according to claim 1,
wherein the identifier is an attached synchronization marker (ASM).

* * * * *